US009633857B1

(12) United States Patent
Smith et al.

(10) Patent No.: US 9,633,857 B1
(45) Date of Patent: Apr. 25, 2017

(54) SEMICONDUCTOR STRUCTURE INCLUDING A TRENCH CAPPING LAYER AND METHOD FOR THE FORMATION THEREOF

(71) Applicant: GLOBALFOUNDRIES Inc., Grand Cayman (KY)

(72) Inventors: Elliot John Smith, Dresden (DE); Steffen Sichler, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/087,392

(22) Filed: Mar. 31, 2016

(51) Int. Cl.
*H01L 21/28* (2006.01)
*H01L 27/12* (2006.01)
*H01L 29/06* (2006.01)
*H01L 29/08* (2006.01)
*H01L 29/51* (2006.01)
*H01L 23/535* (2006.01)
*H01L 21/84* (2006.01)
*H01L 29/66* (2006.01)
*H01L 21/768* (2006.01)

(52) U.S. Cl.
CPC .. *H01L 21/28123* (2013.01); *H01L 21/76897* (2013.01); *H01L 21/84* (2013.01); *H01L 23/535* (2013.01); *H01L 27/1203* (2013.01); *H01L 29/0653* (2013.01); *H01L 29/0847* (2013.01); *H01L 29/517* (2013.01); *H01L 29/66545* (2013.01)

(58) Field of Classification Search
CPC .................. H01L 21/28123; H01L 21/76897
See application file for complete search history.

(56) References Cited

U.S. PATENT DOCUMENTS

| | | | |
|---|---|---|---|
| 5,208,168 A | 5/1993 | Parrillo et al. | |
| 6,153,473 A | 11/2000 | Calafut et al. | |
| 6,309,942 B1 | 10/2001 | Tsui et al. | |
| 6,350,661 B2 | 2/2002 | Lim et al. | |
| 6,657,276 B1 | 12/2003 | Karlsson et al. | |
| 7,442,620 B2 | 10/2008 | Wu et al. | |
| 8,022,442 B2 | 9/2011 | Ookura | |
| 2005/0275060 A1 | 12/2005 | Dokumaci et al. | |

(Continued)

FOREIGN PATENT DOCUMENTS

EP 2701186 A1 2/2014
EP 2701187 A2 2/2014

*Primary Examiner* — Marc Armand
(74) *Attorney, Agent, or Firm* — Amerson Law Firm, PLLC

(57) ABSTRACT

A semiconductor structure includes a trench isolation structure, a trench capping layer, a gate structure and a sidewall spacer. The trench isolation structure includes a first electrically insulating material. The trench capping layer is provided over the trench isolation structure. The trench capping layer includes a second electrically insulating material that is different from the first electrically insulating material. The gate structure includes a gate insulation layer including a high-k material and a gate electrode over the gate insulation layer. The gate structure has a first portion over the trench capping layer. The sidewall spacer is provided adjacent the gate structure. A portion of the sidewall spacer is provided on the trench capping layer and contacts the trench capping layer laterally of the gate insulation layer.

12 Claims, 17 Drawing Sheets

(56) References Cited

U.S. PATENT DOCUMENTS

| | | | |
|---|---|---|---|
| 2012/0077319 A1* | 3/2012 | Lee | H01L 21/823814 |
| | | | 438/229 |
| 2012/0181663 A1 | 7/2012 | Lukaitis et al. | |
| 2014/0054698 A1 | 2/2014 | Liu et al. | |
| 2014/0054699 A1 | 2/2014 | Liu et al. | |
| 2014/0252500 A1* | 9/2014 | Cheng | H01L 29/7834 |
| | | | 257/408 |

* cited by examiner

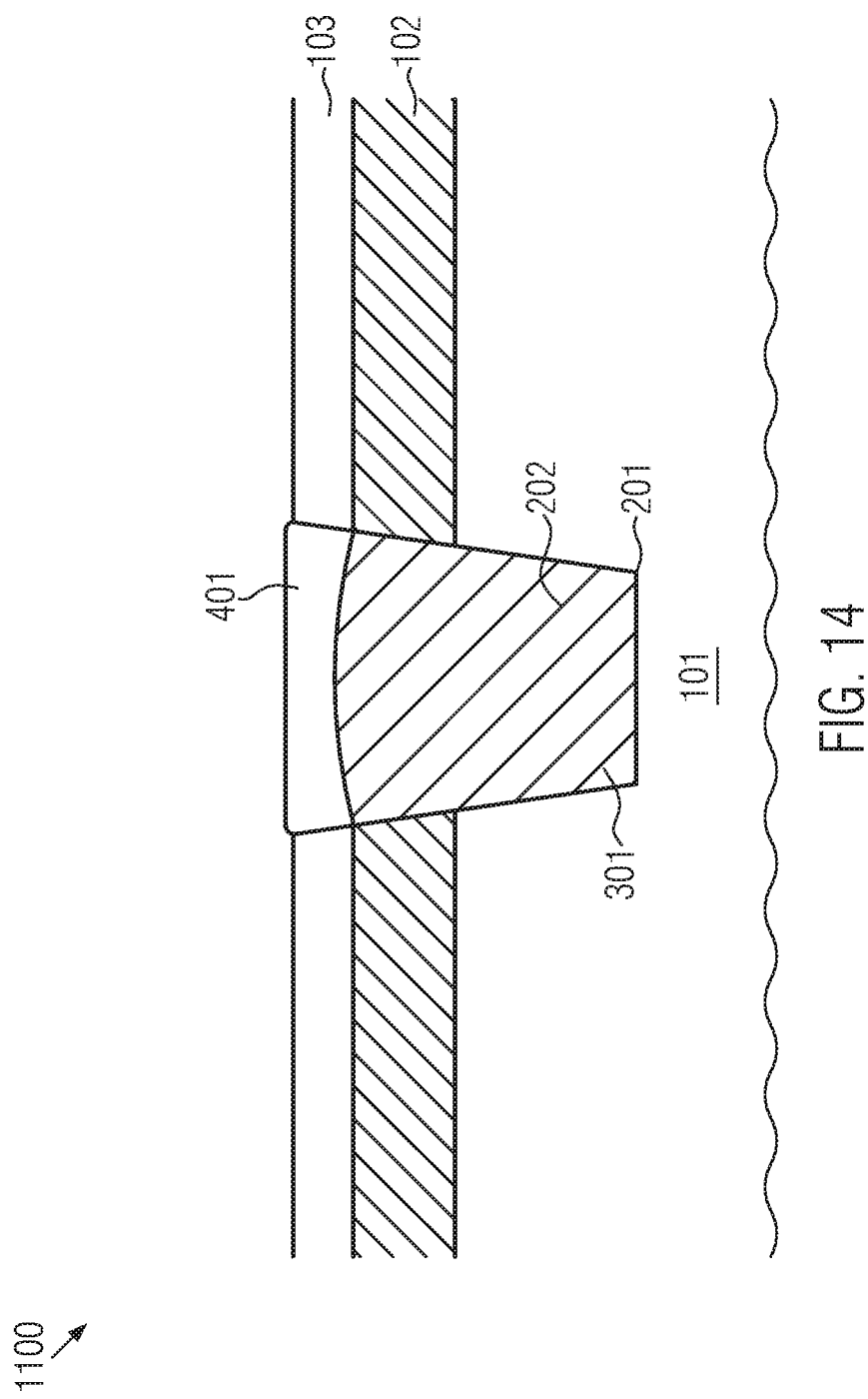

SEMICONDUCTOR STRUCTURE INCLUDING A TRENCH CAPPING LAYER AND METHOD FOR THE FORMATION THEREOF

BACKGROUND OF THE INVENTION

1. Field of the Invention

Generally, the present disclosure relates to integrated circuits and methods for the formation thereof, in particular to integrated circuits wherein field effect transistors including gate structures having a gate insulation layer wherein a high-k material is provided are formed.

2. Description of the Related Art

Integrated circuits typically include a large number of circuit elements, in particular field effect transistors. In a field effect transistor, a gate structure including a gate electrode and a gate insulation layer that provides electrical insulation between the gate electrode and the channel region may be provided. Adjacent the channel region, a source region and a drain region that are doped differently than the channel region are provided. Depending on an electric voltage applied to the gate electrode, the field effect transistor can be switched between an on-state and an off-state, wherein an electrical conductivity of the channel region in the on-state is greater than an electrical conductivity of the channel region in the off-state.

Integrated circuits including field effect transistors may be formed in accordance with semiconductor-on-insulator (SOI) technology, wherein the source, channel and drain regions of the transistors are formed in a relatively thin semiconductor layer that is separated from a support substrate, which may be a semiconductor substrate, for example a silicon wafer or die, by an electrically insulating layer, which may be a silicon dioxide layer. SOI technology may have some advantages associated therewith, which include a reduced power consumption of a semiconductor-on-insulator circuit compared to a bulk semiconductor integrated circuit having the same performance.

For providing electrical connections to the source regions, drain regions and gate electrodes of field effect transistors, contacts extending through an interlayer dielectric that is provided over the field effect transistors may be formed. The contacts may be formed by etching contact holes through the interlayer dielectric and filling the contact holes with an electrically conductive material such as, for example, tungsten.

For providing electrical insulation between adjacent circuit elements, such as field effect transistors, trench isolation structures that include trenches filled with an electrically insulating material such as, for example, silicon dioxide may be formed. If the active region of a field effect transistor wherein the source, drain and channel regions of the field effect transistor are provided is too short, or if there is a misalignment between the contact holes and the source regions, drains regions and/or gate electrodes in the formation of the contact holes, an etching of the electrically insulating material in the trench isolation structures may occur, so that a contact hole extending through the trench isolation structure and/or the electrically insulating layer of a semiconductor-on-insulator structure is formed. When such a contact hole is filled with the electrically conductive material, it may provide an electric short to the semiconductor material of the support substrate of the semiconductor-on-insulator structure, which may adversely affect the functionality of the integrated circuit.

Furthermore, gate structures of field effect transistors may have an overlap with a trench isolation structure adjacent the field effect transistors. Thus, there may be portions of the gate structures overlapping the trench isolation structure, wherein the gate insulation layers of the gate structures are provided on the electrically insulating material in the trench isolation structure.

In some techniques for the manufacturing of integrated circuits, cleaning processes may be performed wherein a cleaning agent is used that can attack the electrically insulating material in the trench isolation structures, which can occur, in particular, in embodiments wherein the electrically insulating material in the trench isolation structures includes silicon dioxide. In such cleaning processes, an under etching of the portions of the gate structures that overlap the trench isolation structure may occur, wherein the electrically insulating material of the trench isolation structure is removed below the gate insulation layers of the gate structures. Thus, the cleaning agent can contact the high-k material of the gate insulation layers. Thus, an etching of the high-k material by the cleaning agent may occur, so that portions of the gate insulation layers are removed. In some situations, even portions of the gate insulation layers over the active regions of the field effect transistors may be etched by the cleaning agent, which can adversely affect the functionality of the integrated circuit, effectively killing the device.

The present disclosure provides semiconductor structures and methods for the formation thereof which may help to substantially overcome or at least reduce the above-mentioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a trench isolation structure, a trench capping layer, a gate structure and a sidewall spacer. The trench isolation structure includes a first electrically insulating material. The trench capping layer is provided over the trench isolation structure. The trench capping layer includes a second electrically insulating material that is different from the first electrically insulating material. The gate structure includes a gate insulation layer including a high-k material and a gate electrode over the gate insulation layer. The gate structure has a first portion over the trench capping layer. The sidewall spacer is provided adjacent the gate structure. A portion of the sidewall spacer is provided on the trench capping layer and contacts the trench capping layer laterally of the gate insulation layer.

An illustrative method disclosed herein includes providing a semiconductor structure including a trench isolation structure. The trench isolation structure includes a first electrically insulating material. A trench capping layer is formed over the trench isolation structure. The trench capping layer includes a second electrically insulating material that is different from the first electrically insulating material. A gate stack is formed over the semiconductor structure. The gate stack includes a layer of a high-k material and a layer of a gate electrode material. The gate stack is patterned, wherein a gate structure having a first portion over a first portion of the trench capping layer is formed. The patterning of the gate stack exposes a second portion of the trench capping layer adjacent the gate structure. A sidewall spacer is formed adjacent the gate structure. A portion of the sidewall spacer is formed on the exposed second portion of the trench capping layer.

BRIEF DESCRIPTION OF THE DRAWINGS

The disclosure may be understood by reference to the following description taken in conjunction with the accompanying drawings, in which like reference numerals identify like elements, and in which:

FIGS. 1-7a show schematic cross-sectional views of a portion of a semiconductor structure according to an embodiment in stages of a method of manufacturing a semiconductor structure according to an embodiment;

FIG. 7b shows a schematic top view of the semiconductor structure shown in FIGS. 1-7a at the stage of the method of manufacturing a semiconductor structure shown in FIG. 7a;

FIGS. 11-14 show schematic cross-sectional views of a semiconductor structure according to an embodiment in stages of a method of manufacturing a semiconductor structure according to an embodiment.

Figure 1:
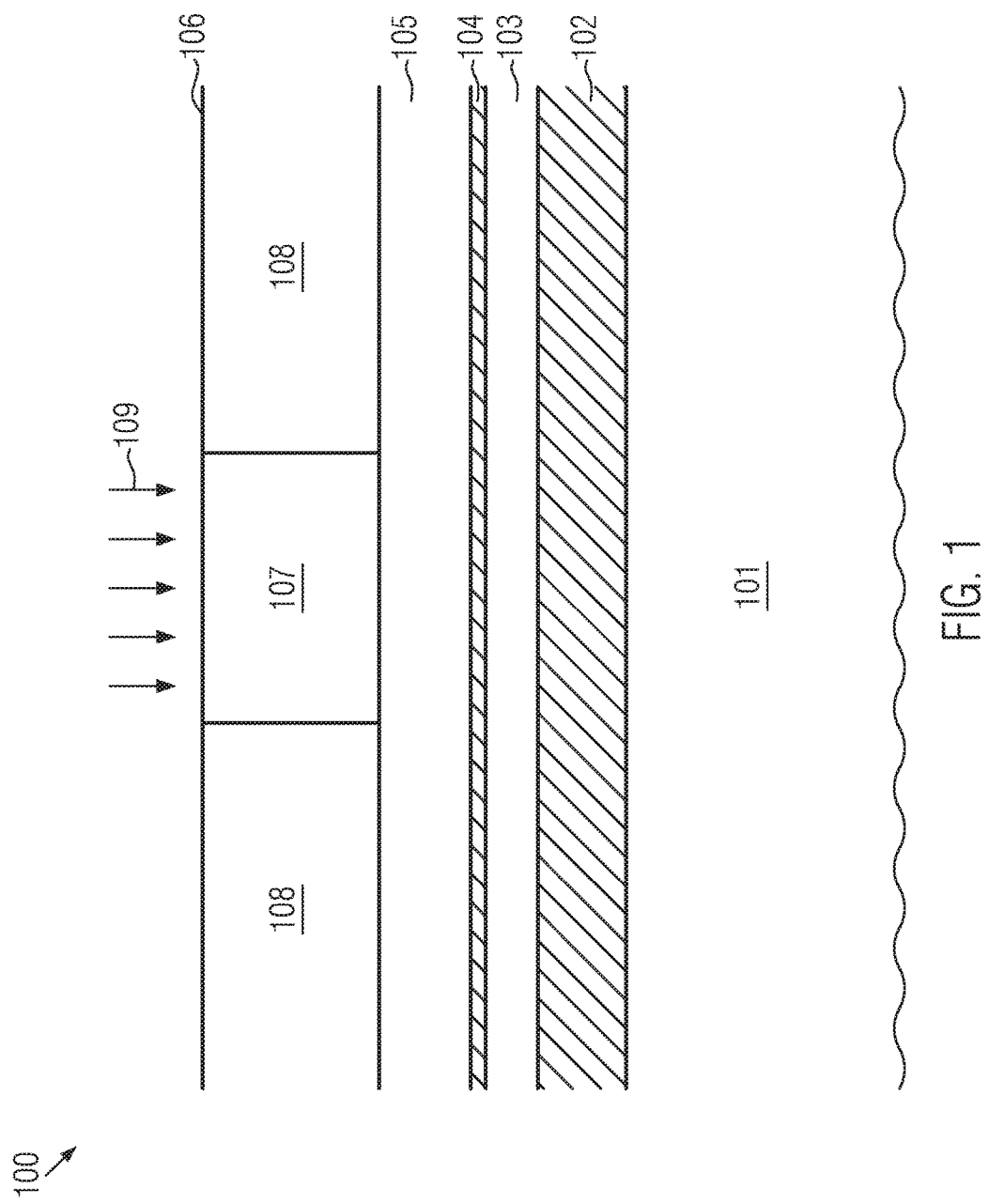

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure provides techniques that may allow substantially eliminating or at least reducing problems caused by a removal of high-k materials in gate insulation layers of field effect transistors by cleaning agents that can under etch portions of gate structures overlapping trench isolation structures. Furthermore, techniques as disclosed herein may help to avoid an inadvertent etching of contact holes through trench isolation structures and/or electrically insulating layers of semiconductor-on-insulator (SOI) structures.

In embodiments disclosed herein, a silicon nitride trench capping layer may be formed on top of a trench isolation structure directly before the deposition of high-k metal gate stacks. In some embodiments, the formation of the silicon nitride capping layer may include a patterning of a silicon nitride layer wherein a mask formed by means of techniques of photolithography is used. In the photolithography process performed for forming the mask that is used in the patterning of the silicon nitride trench capping layer, a photomask that is inverse to a photomask employed in a photolithography process performed for forming a mask used in the formation of the trench isolation structure, or a photomask that is inverse to a photomask used in a photolithography process used in the patterning of a gate stack, may be employed. Herein, a first photomask will be denoted as inverse to a second photomask, if, in a photolithography process wherein the first photomask is used, portions of a semiconductor structure that are not irradiated with actinic radiation in a photolithography process wherein the second photomask is used are irradiated, and vice versa. In other embodiments, in a photolithography process performed for forming the trench isolation structure and in a photolithography process performed for forming the trench capping layer, a same photomask may be used, and a positive photoresist may be used in one of the photolithography processes, and a negative photoresist may be used in the other photolithography process. For example, a positive photoresist may be employed in the formation of the trench isolation structure, and a negative photoresist may be employed in the formation of the trench capping layer.

In further embodiments, self-aligned techniques may be used for patterning the trench capping layer.

The trench capping layer need not be formed of silicon nitride. Additionally or alternatively, the trench capping layer may include silicon borocarbonitride and/or silicon carbonitride.

The trench capping layer and a sidewall spacer formed at a gate structure of a field effect transistor, which may also be formed of silicon nitride or a low-k material like silicon borocarbonitride (SiBCN) or silicon carbonitride (SiCN), may provide an encapsulation of the high-k material of the gate insulation layer. The encapsulation of the high-k material provided by the trench capping layer and the sidewall spacer may protect the high-k material from cleaning agents that are used in cleaning processes that are performed in the manufacturing of the integrated circuit, and which might etch the high-k material in the absence of the encapsulation provided by the trench capping layer and the sidewall spacer.

In some embodiments, a portion of the trench capping layer that is not covered by the gate structure and/or the sidewall spacer may be removed in a cap removal etch process, which may be a dry etch process adapted to remove silicon nitride. A wet etch process could also be used to remove the silicon nitride cap. The cap removal etch process may be performed for removing a gate capping layer, which may be formed of silicon nitride, and it can also etch the silicon nitride trench capping layer.

In other embodiments, the trench capping layer may initially be provided with a greater thickness than the gate capping layer, and the cap removal etch process may be stopped as soon as the gate capping layer is removed. Thus, portions of the trench capping layer that are not covered by the gate structure and/or the sidewall spacer may partially remain in the semiconductor structure, and may help to substantially avoid or at least reduce a risk of an inadvertent etching of contact holes through a trench isolation structure and/or an electrically insulating layer of a semiconductor-on-insulator structure. FIG. 1 shows a schematic cross-sectional view of a portion of a semiconductor structure 100 according to an embodiment at a stage of a method of manufacturing a semiconductor structure according to an embodiment. A schematic top view of a greater portion of the semiconductor structure 100 at a later stage of the method of manufacturing a semiconductor structure is shown in FIG. 7b, wherein the cross-section of FIG. 1, as well as the cross-sections of FIGS. 2-7a are along the line A-A (shown in FIG. 7b).

The semiconductor structure 100 may include a support substrate 101, an electrically insulating layer 102 over the support substrate 101 and a semiconductor material layer 103 over the electrically insulating layer 102. The semiconductor material layer 103, the electrically insulating layer 102 and the support substrate 101 provide a semiconductor-on-insulator (SOI) structure, wherein active regions of field effect transistors including source, channel and drain regions may be formed in the semiconductor material of the semiconductor material layer 103, as will be described in more detail below. In some embodiments, the semiconductor material layer 103 and the support substrate may include silicon, and the electrically insulating layer 102 may include silicon dioxide.

A hardmask layer 105, which may include silicon nitride, may be formed over the semiconductor material layer 103. In some embodiments, a pad layer 104 may be provided between the hardmask layer 105 and the semiconductor material layer 103, wherein a material of the pad layer 104 may be selected such that the material of the hardmask layer 105 may be etched selectively relative to the material of the pad layer 104. In embodiments wherein the hardmask layer 105 includes silicon nitride, the pad layer 104 may include silicon dioxide. For forming the pad layer 104 and the hardmask layer 105, techniques of oxidation and/or techniques of deposition, such as chemical vapor deposition and/or plasma enhanced chemical vapor deposition, may be used.

A photoresist layer 106 may be provided over the hardmask layer 105. In some embodiments, the photoresist layer 106 may be a substantially homogeneous layer of photoresist. In other embodiments, a photoresist layer stack may be used, which may include one or more optical planarization layers and/or an additional hardmask layer and/or bottom anti-reflective coating layers in addition to a photoresist layer. An example of a photoresist layer stack including a plurality of sublayers will be described below with reference to FIG. 4.

The photoresist layer 106 may be formed by means of techniques for forming a photoresist layer, such as spin coating. In some embodiments, the photoresist layer 106 may include a positive photoresist, wherein an irradiation of the photoresist with actinic radiation such as, for example, ultraviolet light, may increase a solubility of the photoresist in a developer.

A photolithography process may be performed, wherein a portion 107 of the photoresist layer 106 is exposed with actinic radiation, as schematically illustrated by arrows 109. Thereafter, the exposed portion 107 of the photoresist layer 106 may be removed by means of a developer. Unexposed portions 108 of the photoresist layer 106 remain on the hardmask layer 105 and form a photoresist mask. Other processing steps associated with photolithography, such as, for example, prebake and/or post bake processes, may also be performed.

Figure 15B:
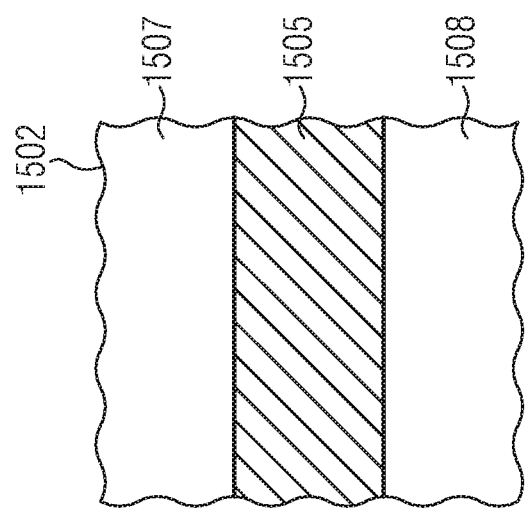
FIGS. 15a-15b schematically illustrate photomasks that may be used in methods of manufacturing a semiconductor structure according to embodiments.
Figure 15A:
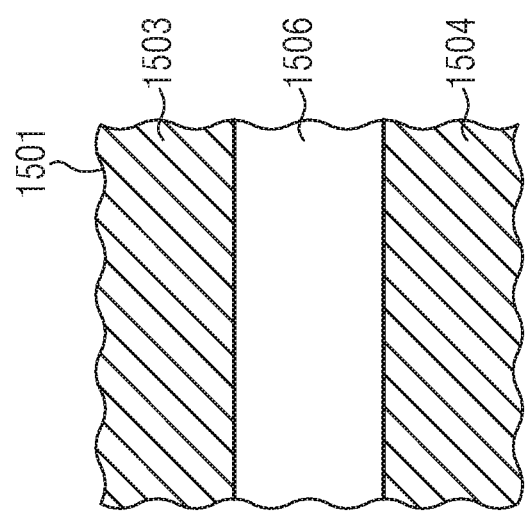

The photolithography process may be performed using a photomask 1501, a portion of which is shown in a simplifying manner in FIG. 15a. The photomask 1501 may include portions 1503, 1504 blocking a transmission of actinic radiation towards the semiconductor structure 100 when the photomask 1501 is projected on the semiconductor structure 100. Additionally, the photomask 1501 may include a portion 1506 that transmits actinic radiation when the photomask 1501 is projected on the semiconductor structure 100. Actinic radiation transmitted by the portion 1506 may be projected on the portion 107 of the photoresist layer 106, so that the portion 107 is exposed.

Figure 2:
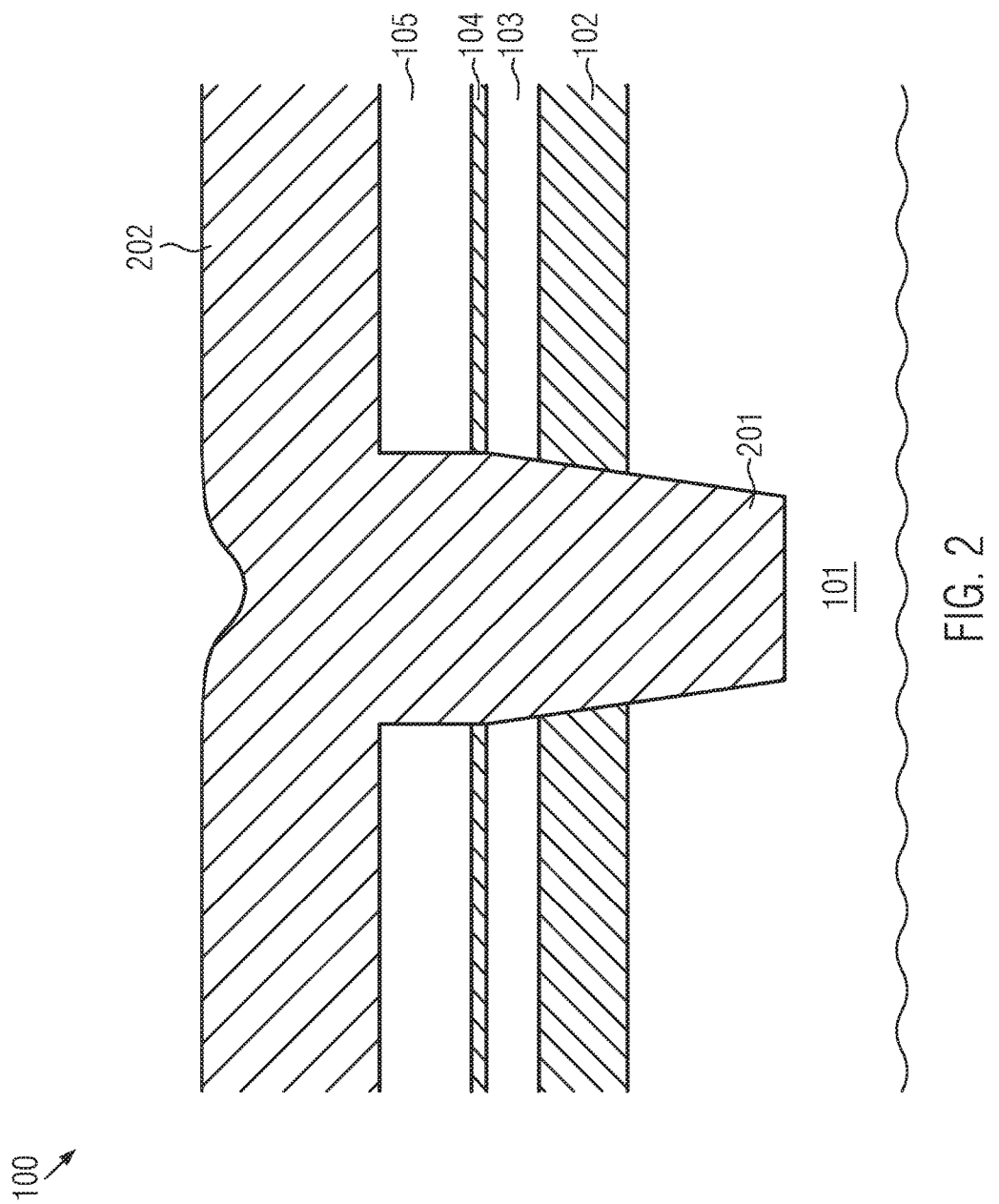

FIG. 2 shows a schematic cross-sectional view of the semiconductor structure 100 in a later stage of the manufacturing of a semiconductor structure. After the formation of the photoresist mask from the photoresist layer 106, an etch process adapted to remove the material of the hardmask layer 105 may be performed. Thus, openings of the hardmask layer 105 may be provided at locations that are not covered by the photoresist mask. Then, the photoresist mask may be removed by means of a resist strip process. Thereafter, one or more etch processes adapted for removing the materials of the pad layer 104, the semiconductor material layer 103, the electrically insulating layer 102 and the support substrate 101 may be performed, wherein a trench 201 is formed in the semiconductor structure 100. Thereafter, a layer of a first electrically insulating material 202 may be deposited over the semiconductor structure 100. The first electrically insulating material 202 may include silicon dioxide, and it may be deposited by means of deposition techniques such as chemical vapor deposition and/or plasma enhanced chemical vapor deposition. In some embodiments, a part of the layer of the first electrically insulating material 202 may be formed by means of an oxidation process adapted for oxidizing the semiconductor material of the semiconductor material layer 103 and the support substrate 101. In some embodiments, the layer 202 of the first electrically insulating material may be a substantially homogeneous layer, and no liners of other materials than the first electrically insulating material need to be provided below the layer 202 of the first electrically insulating material.

Figure 3:
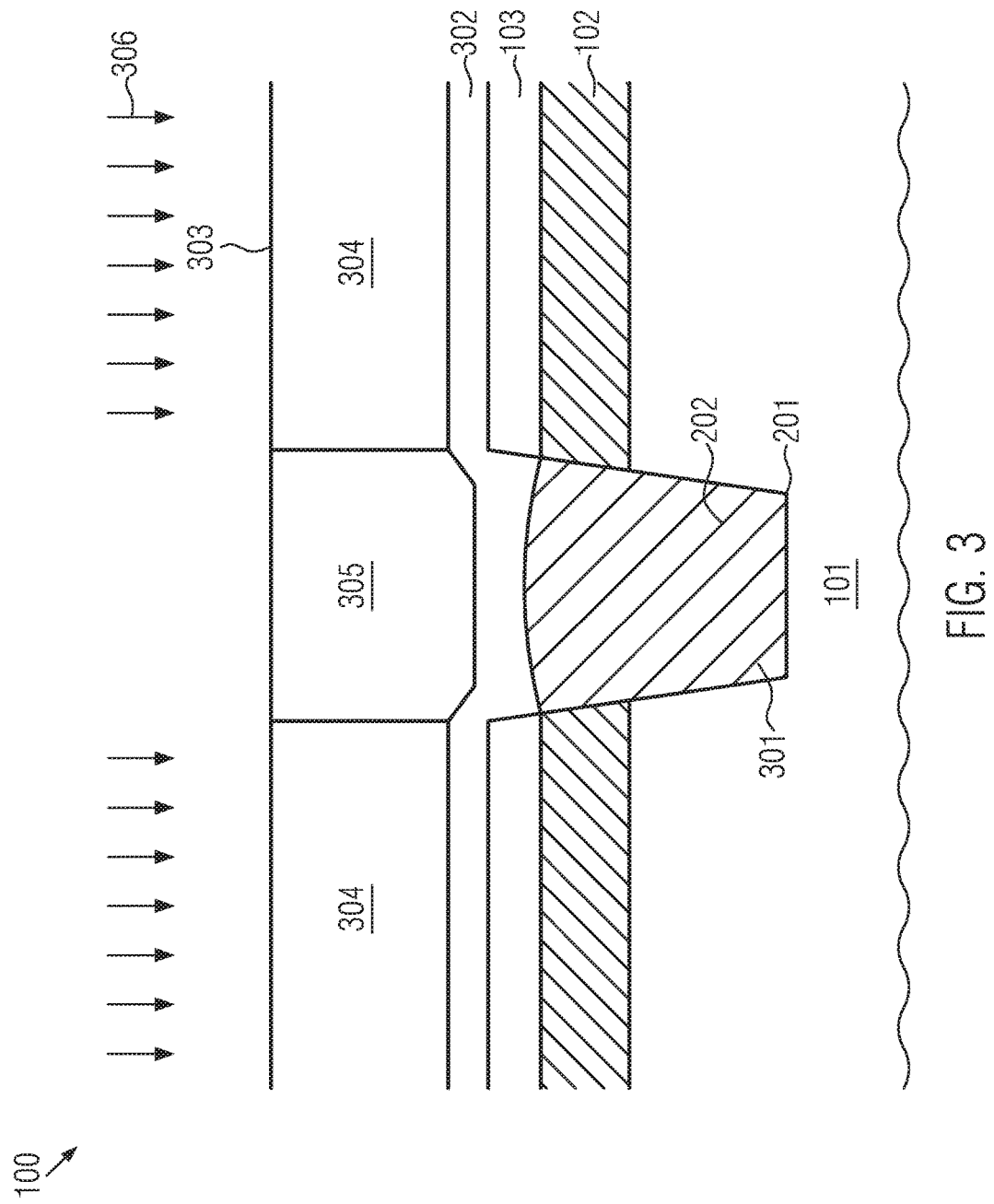

FIG. 3 shows a schematic cross-sectional view of the semiconductor structure 100 in a later stage of the method of manufacturing a semiconductor structure. After the deposition of the layer of the first electrically insulating material 202, a chemical mechanical polishing process may be performed for removing portions of the layer of the first electrically insulating material 202 outside the trench 201. Then, the hardmask layer 105 and the pad layer 104 may be removed by means of one or more etch processes, and the portion of the layer of the first electrically insulating material 202 in the trench 201 may be recessed by means of an etch back process.

The trench 201 and the portion of the layer of the first electrically insulating material 202 in the trench 201 may provide a trench isolation structure 301, which may be a shallow trench isolation structure.

Thereafter, a layer 302 of a second electrically insulating material may be deposited over the semiconductor structure 100, for example, by means of a chemical vapor deposition process or a plasma enhanced chemical vapor deposition process. The second electrically insulating material of the layer 302 may be a different material than the first electrically insulating material 202 of the trench isolation structure 301, and it may be selected such that it is less susceptible of being etched by a cleaning agent that is used in one or more cleaning processes that may be performed in later stages of the method of manufacturing a semiconductor structure, such as, for example, diluted hydrofluoric acid, than the first electrically insulating material of the layer 202 in the trench isolation structure 301. In some embodiments, the layer 302 of the second electrically insulating material may include silicon nitride, silicon borocarbonitride and/or silicon carbonitride.

Thereafter, a photoresist layer 303 may be formed over the semiconductor structure 100, for example, by means of techniques of spin coating. In some embodiments, the photoresist layer 303 may be a substantially homogeneous photoresist layer. In other embodiments, a photoresist layer stack including a plurality of sublayers, such as, for example, an optical planarization layer, a hardmask, a bottom anti-reflective coating layer and a photoresist layer, may be used. An example of a photoresist layer stack including a plurality of sublayers will be described below with reference to FIG. 4.

A photolithography process may be performed, wherein a portion 304 of the photoresist layer 303 is exposed by irradiation with actinic radiation, as schematically denoted by arrows 306. A portion 305 of the photoresist layer 303 is not exposed. Thereafter, the photoresist layer 303 may be developed to form a photoresist mask over the layer 302 of the second electrically insulating material. The photoresist mask formed from the photoresist layer 303 may cover the trench isolation structure 301, whereas portions of the semiconductor material layer 103 adjacent the trench isolation structure 301 are not covered by the photoresist mask.

In some embodiments, the photoresist layer 303 may include a photoresist of the same type as the photoresist layer 106 that is used in the formation of the trench isolation structure 301. Thus, in embodiments wherein the photoresist layer 106 includes a positive photoresist, the photoresist layer 303 may also include a positive photoresist.

In such embodiments, for exposing the photoresist layer 303, a photomask 1502, a portion of which is schematically illustrated in a simplified manner in FIG. 15b, may be used, wherein the photomask 1502 is inverse to the photomask 1501 that is used for exposing the photoresist layer 106. Herein, a first photomask will be denoted as being inverse to a second photomask, if the first photomask is suitable for irradiating those portions of the semiconductor structure 100 with actinic radiation in a photolithography process that are not irradiated in a photolithography process wherein the second photomask is used and the second photomask is suitable for irradiating those portions of the semiconductor structure with actinic radiation in a photolithography process that are not irradiated in a photolithography process wherein the first photomask is used. The photomask 1502 may include portions 1507, 1508 adapted for transmitting actinic radiation that correspond to the portions 1503, 1504 of the photomask 1501 that are adapted for blocking actinic radiation, and a portion 1505 adapted for blocking actinic radiation that corresponds to the portion 1506 of the photomask 1501 that is adapted for transmitting actinic radiation.

Thus, the exposed portions 304 of the photoresist layer 303 may be provided over those parts of the semiconductor structure where the unexposed portions 108 of the photoresist layer 106 are provided, and the unexposed portion 305 of the photoresist layer 303 may be provided over those parts of the semiconductor structure 100 where the exposed portion 107 of the photoresist layer 106 is provided. By exposing the photoresist layer 303, a photoresist mask covering those portions of the semiconductor structure 100 that are not covered by the photoresist mask obtained by developing the photoresist layer 106 may be formed. The photoresist mask may be provided by the unexposed portion 305 of the photoresist layer 303. In particular, the photoresist mask formed from the photoresist layer 303 may cover a portion of the layer 302 of the second electrically insulating material over the trench isolation structure 301.

In other embodiments, different types of photoresists may be used for forming the photoresist layer 106, on the one hand, and the photoresist layer 303, on the other hand. For example, in embodiments wherein a positive photoresist is used for forming the photoresist layer 106, a negative photoresist whose solubility in a developer decreases upon irradiation with actinic radiation may be used for forming the photoresist layer 303. Thus, a photomask may be provided by the exposed portions of the photoresist layer 303. In such embodiments, the photomask 1501 that is used for exposing the photoresist layer 106 in the formation of the trench isolation structure 301 may also be used for exposing the photoresist layer 303, so that the exposed portions of the photoresist layer 303 are provided over the trench isolation structure 301.

In further embodiments, the photoresist layer 303 and a photoresist layer 412 (see FIG. 4) employed in the patterning of a gate stack may be formed from a same type of photoresist, for example, a positive photoresist, and photomasks that are mutually inverse to each other may be used for exposing the photoresist layer 303 and the photoresist layer 412. In still further embodiments, the photoresist layer 412 may be formed of a positive photoresist, the photoresist layer 303 may be formed of a negative photoresist, and a same photomask may be used for exposing the photoresist layers 303, 412.

Figure 4:
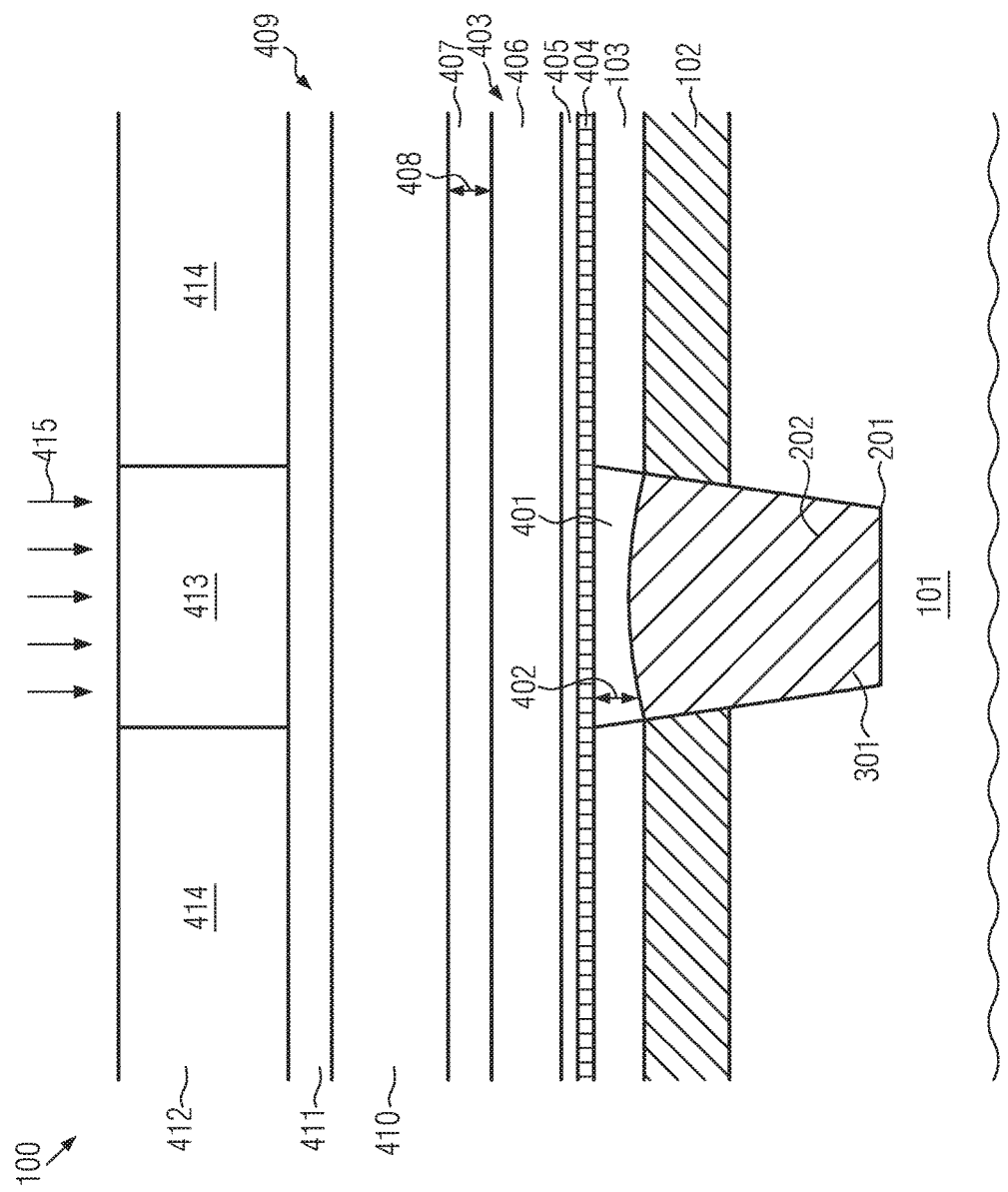

FIG. 4 shows a schematic cross-sectional view of the semiconductor structure 100 in a later stage of the method of manufacturing a semiconductor structure. After exposing and developing the photoresist layer 303, an etch process adapted for removing the second electrically insulating material of the layer 302 may be performed in the presence of the photoresist mask formed from the photoresist layer 303. The etch process may remove the second electrically insulating material from the semiconductor material layer 103. Portions of the layer 302 of the second electrically insulating material over the trench isolation structure 301 may remain in the semiconductor structure 100, and may form a trench capping layer 401.

Thereafter, the photoresist mask may be removed by means of a resist strip process and a gate stack 403 may be formed over the semiconductor structure 100. The gate stack 403 may include a layer 404 of a high-k material such as, for example, hafnium dioxide, zirconium dioxide, hafnium silicon oxynitride, zirconium silicon oxynitride and/or hafnium zirconium oxide. Additionally, the gate stack 403 may include one or more layers of gate electrode material, such as a work function adjustment metal layer 405 over the layer 404 of high-k material and a polysilicon layer 406 over the work function adjustment metal layer 405. Moreover, the gate stack 403 may include a gate capping layer 407 over the polysilicon layer 406. The gate capping layer 407 may be formed of substantially the same material as the trench capping layer 401, for example, silicon nitride. In some embodiments, as will be described in the following with reference to FIGS. 4-8, a thickness 408 of the gate capping layer 407 may be approximately equal to or greater than a thickness 402 of the trench capping layer 401. In other embodiments, which will be described below with reference to FIGS. 9a, 9b and 10, the thickness 408 of the gate capping layer 407 may be smaller than the thickness 402 of the trench capping layer 401.

After the formation of the gate stack 403, a photoresist layer stack 409 may be formed over the gate stack 403. The photoresist layer stack 409 may include an optical planarization layer (OPL) 410, an anti-reflective coating layer 411, for example, a silicon-containing anti-reflective coating (SiARC) layer 411, and a photoresist layer 412, wherein the photoresist layer 412 may include a positive photoresist. In other embodiments, the photoresist layer stack 409 may have a different configuration. For example, in some embodiments, the layer denoted by reference numeral 410 may represent a spin-on hardmask (SOH) layer, and the layer denoted by reference numeral 411 may denote a silicon oxynitride (SiON) layer.

Further features of the gate stack 403 and the photoresist layer stack 409 may correspond to those of gate stacks and photoresist layer stacks conventionally employed in the formation of gate structures of field effect transistors.

After the formation of the photoresist layer stack 409, the photoresist layer 412 of the photoresist layer stack 409 may be exposed, as schematically illustrated by arrows 415. Thus, an exposed portion 413 and an unexposed portion 414 of the photoresist layer 412 may be formed.

Figure 5:
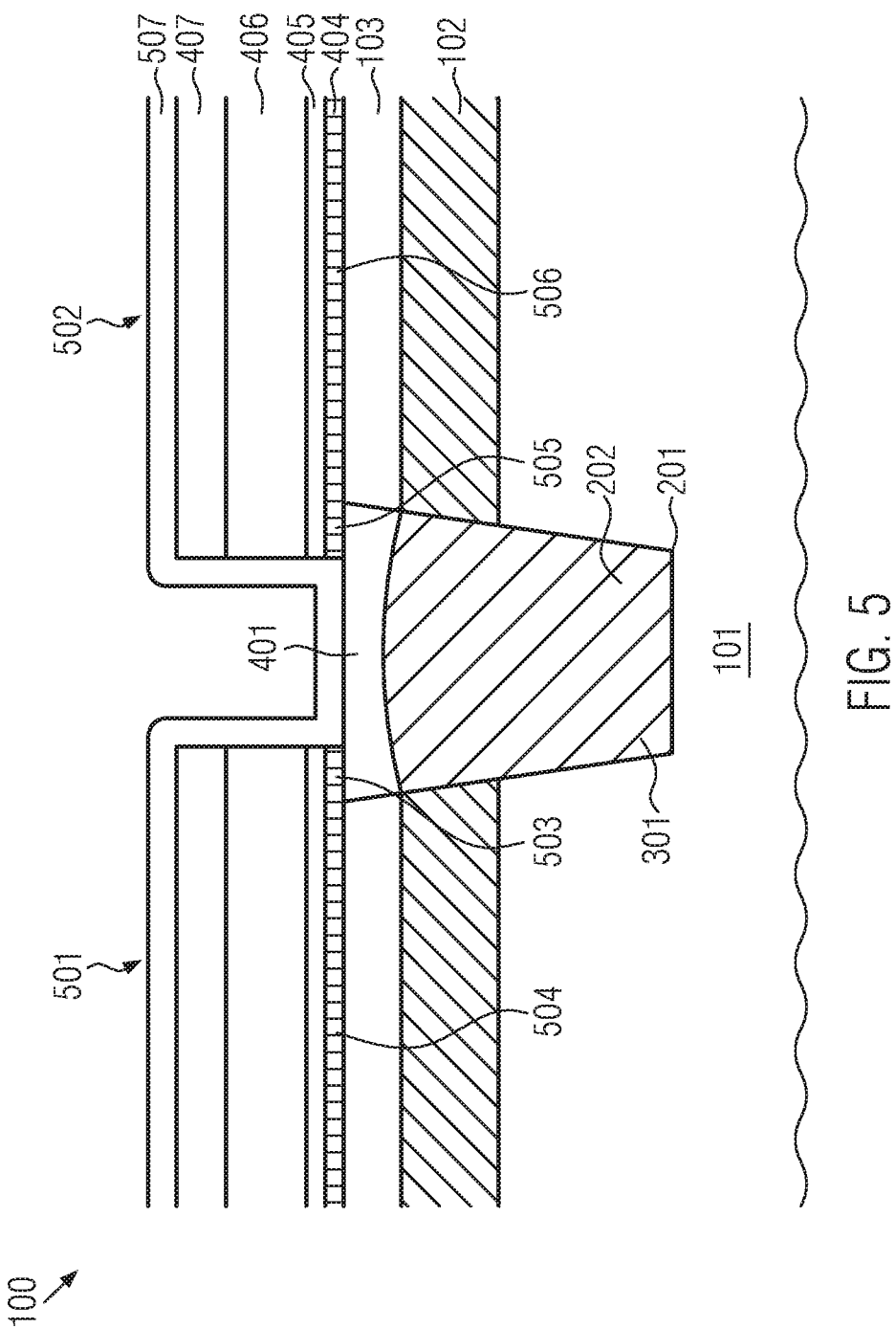

FIG. 5 shows a schematic cross-sectional view of the semiconductor structure 100 in a later stage of the method of manufacturing a semiconductor structure. After exposing the photoresist layer stack 409, a photoresist mask may be formed from the photoresist layer stack by developing the photoresist layer 412 and, optionally, performing one or more etch processes adapted to remove the anti-reflective coating layer 411 and/or the optical planarization layer 410.

Then, one or more etch processes adapted for removing the materials of the gate capping layer 407, the polysilicon layer 406, the work function adjustment metal layer 405 and the layer 404 of high-k material may be performed. Portions of the gate stack 403 that are covered by the photoresist mask are protected by the photoresist mask from being affected by the one or more etch processes, and remain in the semiconductor structure 100, forming a gate structure 501 (at the left side of the trench isolation structure 301 in the view of FIG. 5) and a gate structure 502 (at the right side of the trench isolation structure 301 in the view of FIG. 5). In addition to the gate structures 501, 502, other gate structures, which are denoted by reference numerals 715 to 722 in FIG. 7b, may be formed.

After the etching of the gate stack 403, the photoresist layer stack formed from the photoresist layer stack 409 may be removed by means of one or more photoresist strip and etching processes.

The gate structure 501 may include a portion 503 over the trench capping layer 401 and the trench isolation structure 301, and a portion 504 over a part of the semiconductor material layer 103 wherein a channel region of a field effect transistor 731 (see FIGS. 7a and 7b) will be formed. Similarly, the gate structure 502 may include a portion 505 over the trench capping layer 401 and the trench isolation structure 301, and a portion 506 over a part of the semiconductor material layer 103 wherein a channel region of a field effect transistor 732 (see FIGS. 7a and 7b) will be formed.

Between the portions 503, 505 of the gate structures 501, 502 over the trench capping layer 401, a portion of the trench capping layer 401 that is not covered by any of the layers 404 to 407 of the gate stack 403 may be provided after the etching of the gate stack 403, wherein the material of the trench capping layer 401 is exposed at the surface of the semiconductor structure 100.

After the formation of the gate structures 501, 502, a layer 507 of sidewall spacer material may be deposited over the semiconductor structure 100 using deposition techniques such as chemical vapor deposition and/or plasma enhanced chemical vapor deposition. The layer 507 of sidewall spacer material may be formed of substantially the same material as the trench capping layer 401. In particular, in some embodiments, the layer 507 of sidewall spacer material may include silicon nitride, silicon borocarbonitride and/or silicon carbonitride.

For forming the layer 507 of sidewall spacer material, a substantially isotropic deposition process may be used, so that a thickness of portions of the layer 507 of sidewall spacer material over substantially horizontal portions of the semiconductor structure 100, such as top surfaces of the gate structures 501, 502 and the trench capping layer 401, is approximately equal to a thickness of portions of the layer 507 of sidewall spacer material over inclined portions of the semiconductor structure 100, such as the sidewalls of the gate structures 501, 502.

Figure 6:
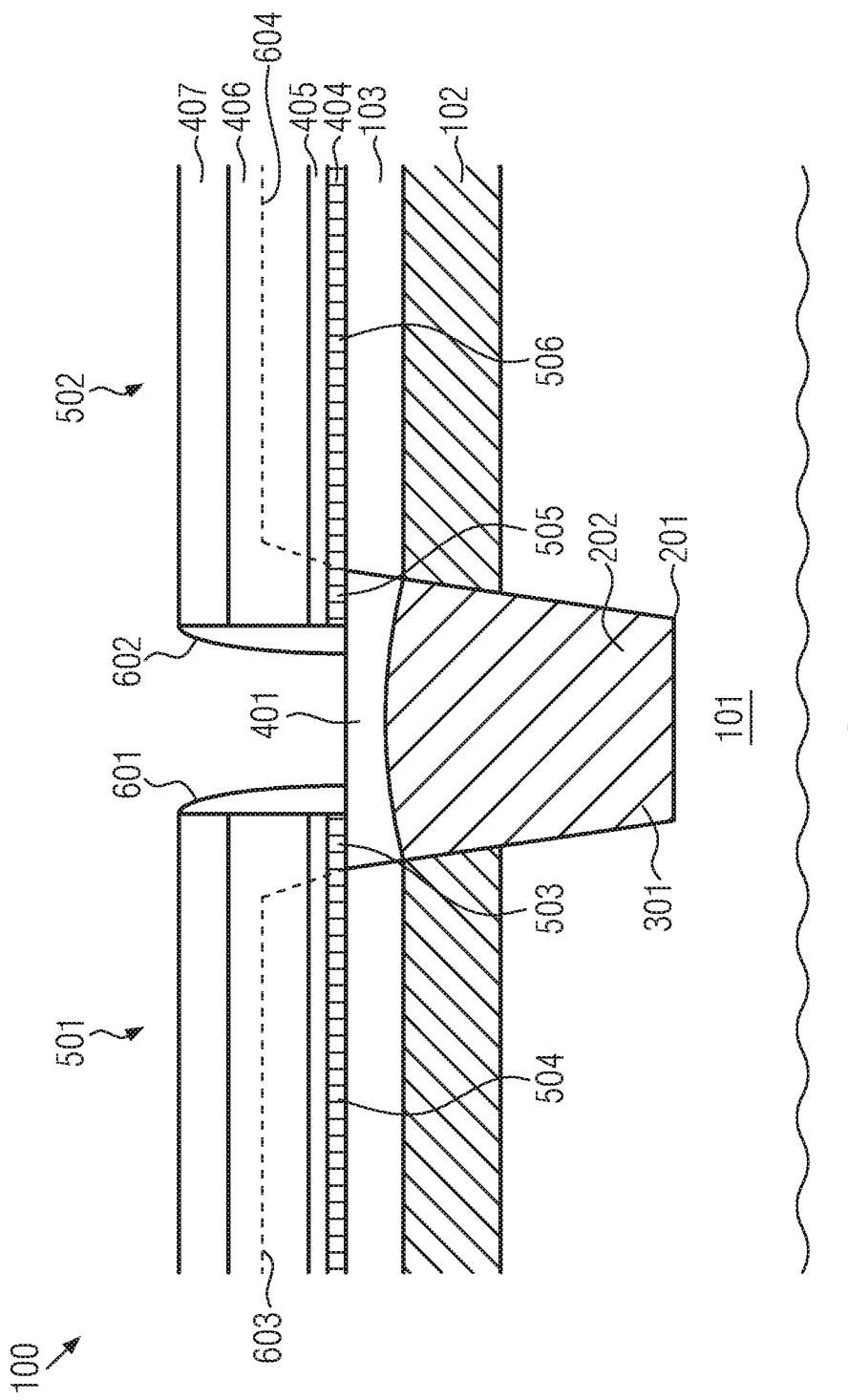

FIG. 6 shows a schematic cross-sectional view of the semiconductor structure 100 at a later stage of the manufacturing process. After a deposition of the layer 507 of sidewall spacer material, an anisotropic sidewall spacer etch process may be performed for removing portions of the layer 507 of sidewall spacer material over the substantially horizontal portions of the semiconductor structure 100. Due to the anisotropy of the sidewall spacer etch process, portions of the layer 507 of sidewall spacer material at inclined portions of the semiconductor structure 100, such as the sidewalls of the gate structures 501, 502, may remain in the semiconductor structure 100, and may form a sidewall spacer 601 at the gate structure 501 and a sidewall spacer 602 at the gate structure 502. As can be seen in the top view of FIG. 7b, at the other gate structures 715 to 722 in the semiconductor structure 100, sidewall spacers 723 to 730 may also be formed.

The sidewall spacer 601 may include a portion adjacent to the portion 503 of the gate structure 501 over the trench capping layer 401 that is provided on the trench capping layer 401 and contacts the trench capping layer 401. Additionally, the sidewall spacer 601 may include portions over the semiconductor material layer 103, which may be located at sidewalls of the portion 504 of the gate structure 501 over the semiconductor material layer 103. Similarly, the sidewall spacer 602 may include a portion over the trench capping layer 401, which may be provided at a sidewall of the portion 505 of the gate structure 502 over the trench capping layer 401. Additionally, the sidewall spacer 602 may include portions over the semiconductor material layer 103.

Since the sidewall spacers 601, 602 are formed from the layer 507 of sidewall spacer material, which was deposited after the removal of portions of the gate stack from the part of the trench capping layer 401 between the gate structures 501, 502, the sidewall spacers 601, 602 may be provided on the trench capping layer 401, substantially without any portion of the gate stack 403, in particular without any portions of the layer 404 of high-k material, between the sidewall spacers 601, 602 and the trench capping layer 401. Thus, the portion of the sidewall spacer 601 on the trench capping layer 401 may contact the trench capping layer 401 laterally of the gate insulation layer of the gate structure 501, which is formed from the layer 404 of high-k material. Similarly, the portion of the sidewall spacer 602 on the trench capping layer 401 may contact the trench capping layer 401 laterally of the gate insulation layer of the gate structure 502 that is formed from the layer 404 of high-k material.

The present disclosure is not limited to embodiments wherein a single layer 507 of sidewall spacer material is used for forming the sidewall spacers 601, 602, and other sidewall spacers 723 to 730 in the semiconductor structure 100. In other embodiments, a plurality of sidewall spacers, which may be formed of different materials, may be formed at each gate structure by substantially isotropic deposition and an anisotropic etching of each of a plurality of layers of sidewall spacer material.

Further features of the sidewall spacers 601, 602, and features of methods used for the formation thereof, may correspond to those of sidewall spacers conventionally employed in the formation of field effect transistors.

After the formation of the sidewall spacers 601, 602, one or more cleaning processes may be performed wherein the semiconductor structure 100 is exposed to a cleaning agent that is capable of etching the high-k material of the layer 404 of high-k material. Additionally, the cleaning agent may be capable of etching the first electrically insulating material of the trench isolation structure 301. In some embodiments, the cleaning agent may include diluted hydrofluoric acid, which can etch high-k materials such as, for example, hafnium dioxide, zirconium dioxide, hafnium silicon oxynitride, zirconium silicon oxynitride and/or hafnium zirconium oxide. Furthermore, diluted hydrofluoric acid can etch silicon dioxide. In other embodiments, one or more cleaning agents other than diluted hydrofluoric acid may be used.

The trench capping layer 401 and the sidewall spacers 601, 602, which may be formed of a different material than the high-k material of the layer 404 and the first electrically insulating material 202 of the trench isolation structure 301, may be affected by the cleaning agent to a relatively small extent. In particular, silicon nitride, which may be used for forming the trench capping layer 401 and the sidewall spacers 601, 602, may be affected by cleaning agents including diluted hydrofluoric acid and other cleaning agents to a relatively small extent. Thus, the sidewall spacers 601, 602 and the trench capping layer 401 can provide an encapsulation of the portion of the layer 404 of high-k material over the trench capping layer 401 and the trench isolation structure 301, which can protect the high-k material from being affected by the cleaning agent. Thus, an inadvertent etching of the high-k material by the cleaning agent may be substantially avoided or at least reduced. Additionally, the trench capping layer 401 can protect the first electrically insulating material 202 in the trench isolation structure 301 from being affected by the cleaning agent.

Similarly, sidewall spacers 723 to 730 formed at other gate structures 715 to 722 in the semiconductor structure 100 can protect gate insulation layers including high-k materials in the gate structures 715 to 722 from being affected by the cleaning agent.

After the cleaning process, one or more selective epitaxial growth processes adapted for depositing a semiconductor material, such as silicon, may be performed. In some embodiments, separate selective epitaxial growth processes may be performed for depositing an N-doped semiconductor material over portions of the semiconductor structure 100 wherein N-channel field effect transistors are to be formed, and for depositing a P-doped semiconductor material over portions of the semiconductor structure 100 wherein P-channel field effect transistors are to be formed. Parameters of the one or more selective epitaxial growth processes may be adapted such that a deposition of semiconductor material is obtained substantially only at portions of the semiconductor structure 100 wherein a semiconductor material, such as, for example, the semiconductor material of the semiconductor material layer 103 or semiconductor material already deposited by selective epitaxial growth, is exposed. Substantially no deposition of semiconductor material or only a deposition of a small amount of semiconductor material may be obtained at portions of the semiconductor structure 100 wherein other materials are provided such as, for example, on surfaces of the trench capping layer 401, the sidewall spacers 601, 602, and the gate capping layer 407. For obtaining a deposition of N-doped semiconductor material only in portions of the semiconductor structure 100 wherein N-channel transistors are to be formed, portions of the semiconductor structure 100 wherein P-channel transistors are to be formed may be covered by a hardmask. Similarly, during the deposition of the P-doped semiconductor material, portions of the semiconductor structure 100 wherein N-channel transistors are to be formed may be covered by a hardmask.

The one or more selective epitaxial growth processes may form a raised source region 603 adjacent the gate structure 501, and a raised source region 604 may be formed adjacent the gate structure 502. As can be seen in the top view of FIG. 7b, at a side of the gate structure 501 opposite the raised source region 603, a raised source and drain region 701 may be formed, and at a side of the gate structure 502 opposite the raised source region 604, a raised source and drain region 702 may be formed. The raised source and drain region 701 may provide a drain region of the transistor 731 and a source region of adjacent transistor 734, thus being a common source and drain region of the transistors 731, 734. The raised source and drain region 702 may provide a drain region of the transistor 732 and a source region of adjacent transistor 735, thus being a common source and drain region of the transistors 732, 735. Since the raised source regions 603, 604 are located in different planes than the plane of drawing of FIG. 6 shown by line A-A in FIG. 7b, the raised source regions 603, 604 are shown by dashed lines in FIG. 6. Additionally, further source and drain regions 703 to 714 may be formed adjacent other gate structures 715 to 722 in the semiconductor structure 100.

Figure 7A:
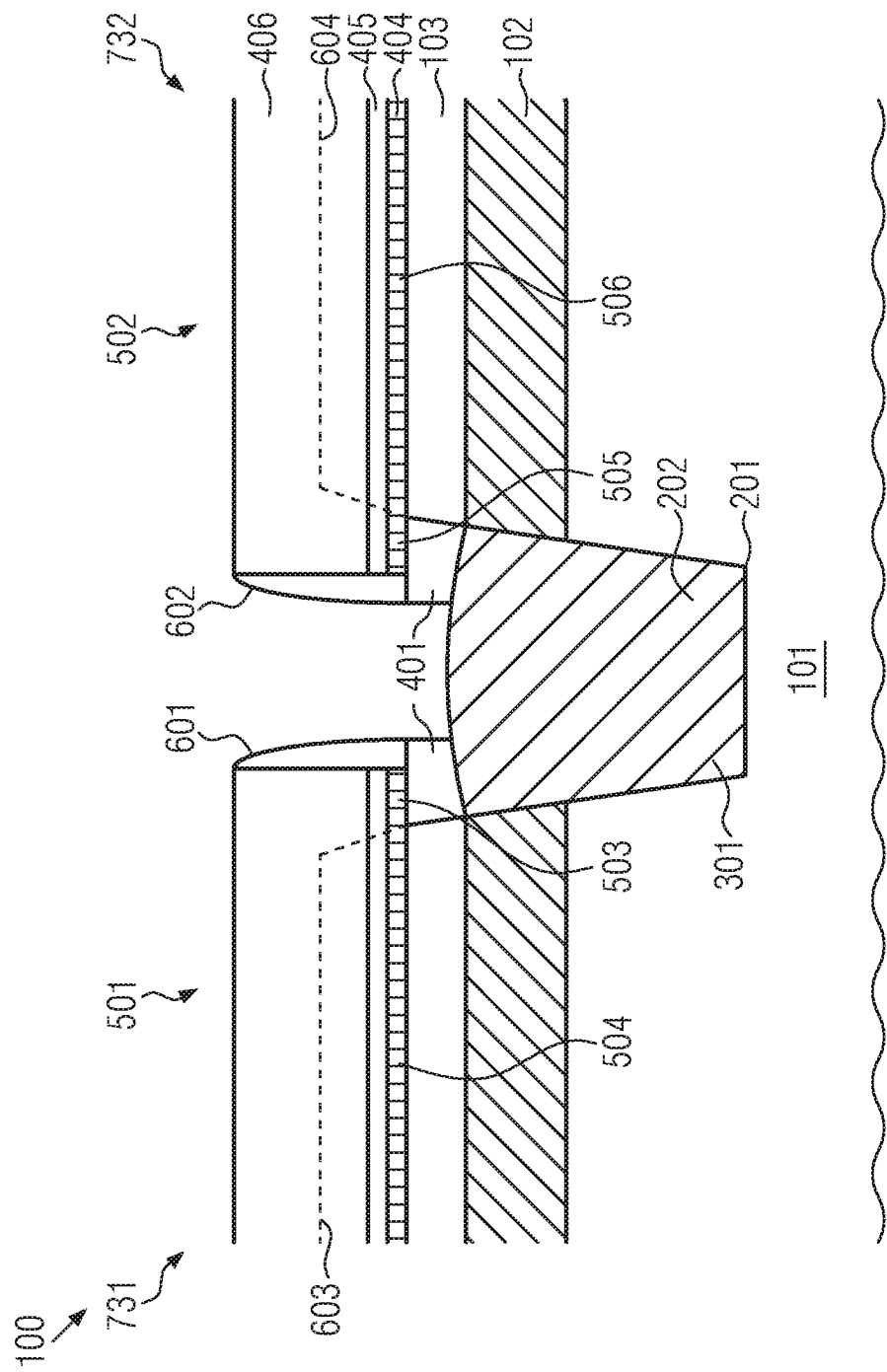
Figure 7B:
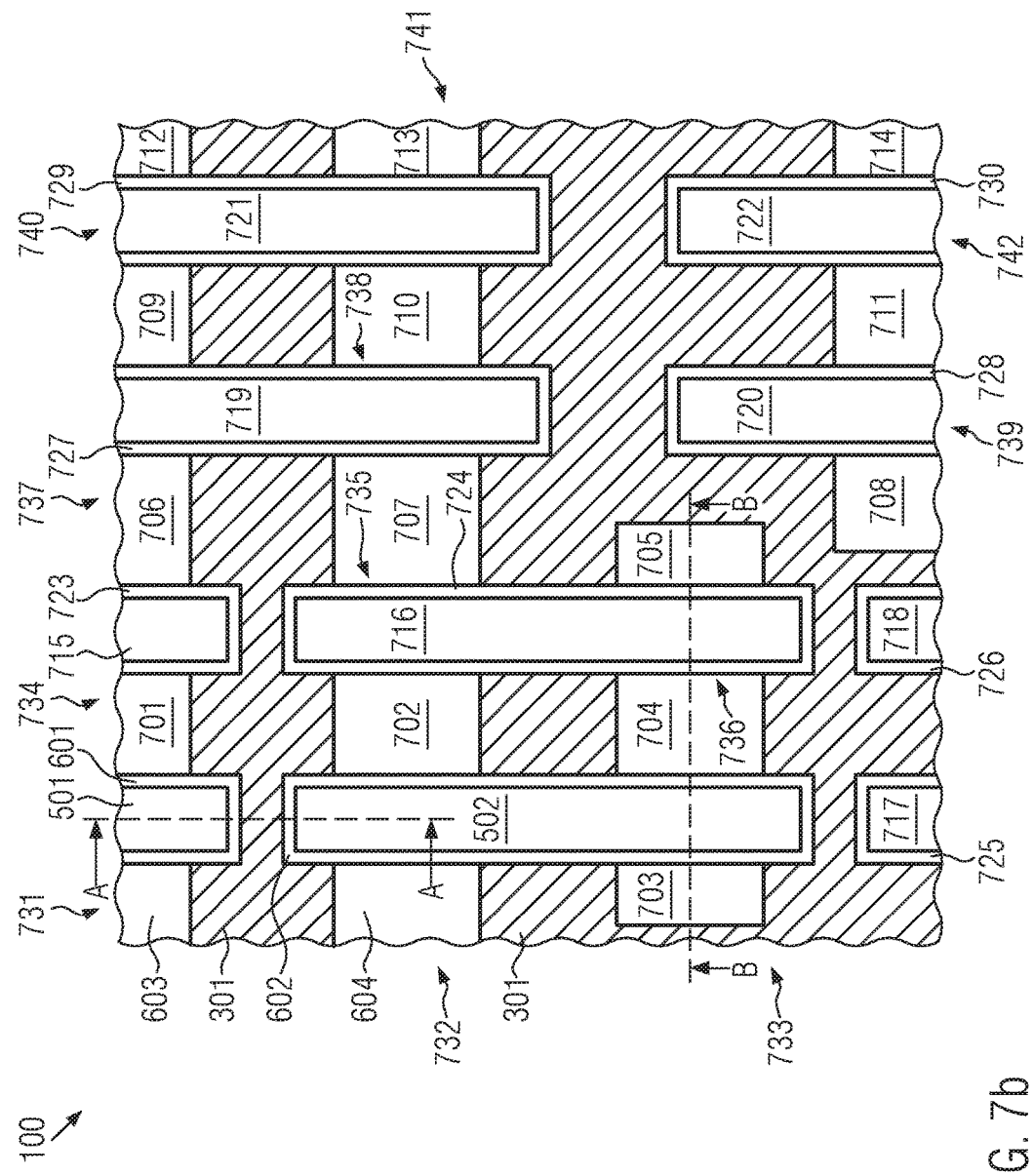

FIG. 7a shows a schematic cross-sectional view of the semiconductor structure 100 in a later stage of the manufacturing process. After the formation of the raised source and drain regions, a cap removal etch process may be performed. The cap removal etch process may include an anisotropic dry etch process adapted for selectively removing the material of the gate capping layer 407. Alternatively an isotropic wet etch could also be used for removing the material of the gate capping layer 407. Since the sidewall spacers 601, 602 and the trench capping layer 401 may be formed of substantially the same material as the gate capping layer 407, the cap removal etch process may also remove a certain amount of material from the sidewall spacers 601, 602 and the trench capping layer 401. Due to the anisotropy of the cap removal etch process, portions of the sidewall spacers 601, 602 at the sidewalls of the layer 404 of high-k material, the work function adjustment metal layer 405 and the polysilicon layer 406 in the gate structures 501, 502 may remain in the semiconductor structure 100. The portions of the sidewall spacers 601, 602 remaining in the semiconductor structure 100 and the polysilicon layer 406 may protect portions of the semiconductor structure 100 therebelow from being affected by an etchant used in the cap removal etch process. Thus, portions of the trench capping layer 401 below the sidewall spacers 601, 602 and below the portions 503, 505 of the gate structures 501, 502 over the trench capping layer 401 may remain in the semiconductor structure 100. However, in embodiments wherein the thickness of the trench capping layer 401 is approximately equal to or smaller than the thickness of the gate capping layer 407, the cap removal etch process may remove the trench capping layer 401 from portions of the trench isolation structure 301 that are neither covered by any sidewall spacer nor by any gate structure. Thus, the first electrically insulating material of the trench isolation structure 301 may be exposed in an area between the sidewall spacers 601, 602.

FIG. 7b shows a schematic top view of the semiconductor structure 100 at the stage of the method of manufacturing a semiconductor structure illustrated in FIG. 7a. As can be seen from FIG. 7b, after the cap removal etch process, the trench isolation structure 301 may be exposed at the surface of the semiconductor structure 100.

In addition to transistors 731, 732, parts of which are shown in cross-sectional view in FIG. 7a, the semiconductor structure 100 may include further transistors 733 to 742, each of which may have a configuration generally corresponding to that of the transistors 731 and 732, wherein some of the transistors 731 to 742 may be N-channel transistors, and others of the transistors 731 to 742 may be P-channel transistors.

The semiconductor structure 100 may include gate structures extending over a respective channel region of two or more of the plurality of field effect transistors 731 to 742. For example, the gate structure 502 may extend over a channel region of the transistor 732 and a channel region of the transistor 733. Similarly, the gate structure 716 may extend over a channel region of the transistor 735 and a channel region of the transistor 736, the gate structure 719 may extend over channel regions of the transistors 737, 738 and the gate structure 721 may extend over channel regions of the transistors 740, 741.

Figure 8:
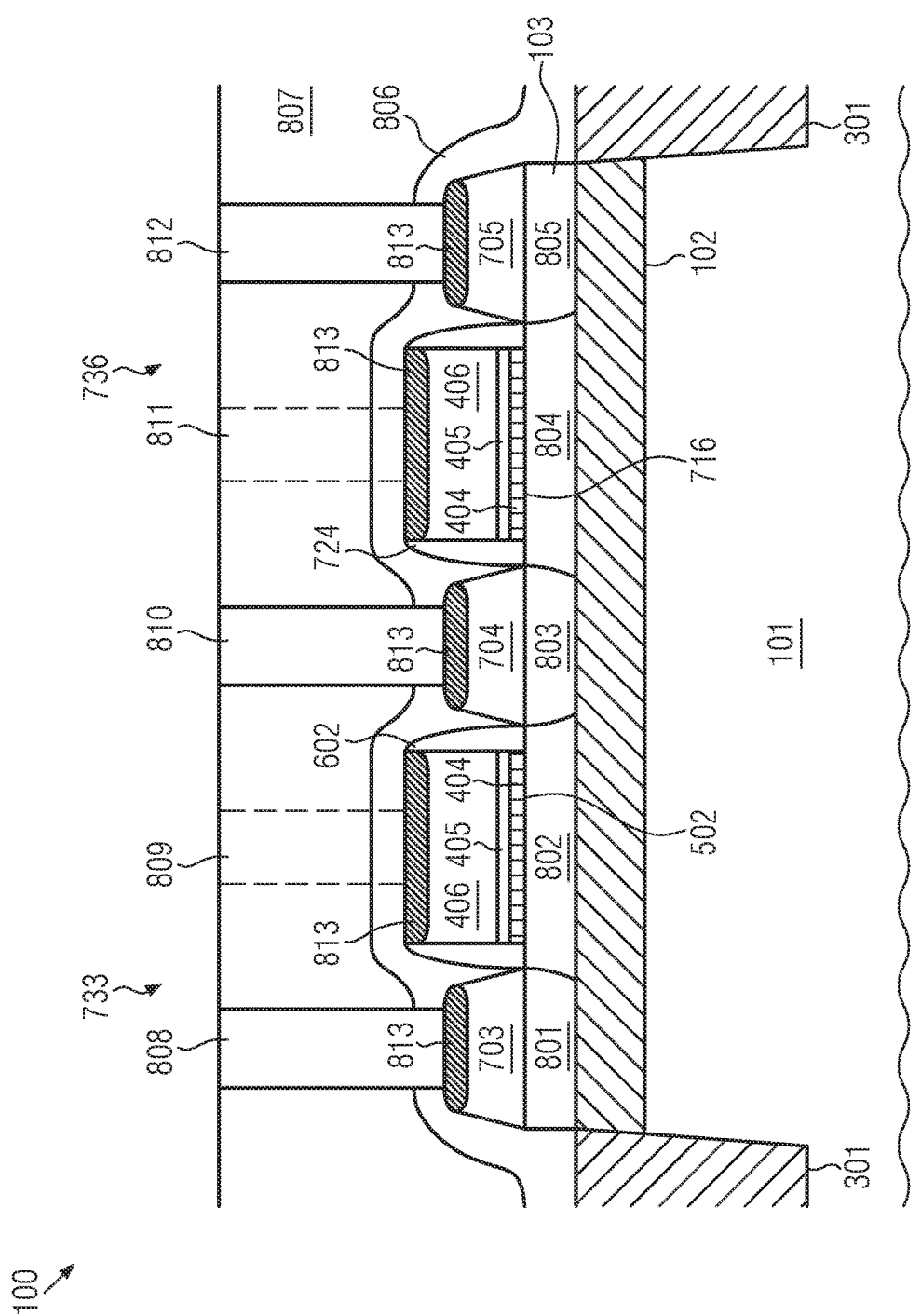
FIG. 8 shows a schematic cross-sectional view of a portion of the semiconductor structure shown in FIGS. 1-7b at a stage of the method of manufacturing a semiconductor structure.

FIG. 8 shows a schematic cross-sectional view of a portion of the semiconductor structure 100 along the line B-B shown in FIG. 7b. While FIGS. 1-7a show cross-sections along a length direction of the gate structures 501, 502, 715 to 722 of the semiconductor structure 100, corresponding to a channel width direction of the transistors 731 to 742, FIG. 8 shows a cross-section along the channel length direction of the transistors 731 to 742, which is approximately perpendicular to the length direction of the gate structures 501, 502, 715 to 722 and the width direction of the transistors 731 to 742.

After the formation of the raised source and drain regions 703, 704, 705, and the other raised source and drain regions 603, 604, 701, 702, 706 to 714 which are not visible in the cross-sectional view of FIG. 8, an annealing process may be performed. In the annealing process, dopants from the raised source and drain regions 703, 704, 705 may diffuse into portions of the semiconductor material layer 103 therebelow. Thus, a source region 801 of the transistor 733, a doped region 803 providing a drain region of the transistor 733 and a source region of the transistor 736 and a drain region 805 of the transistor 736 may be provided. Portions 802, 804 of the semiconductor layer 103 below the gate structures 502, 716 may provide channel regions of the transistors 733, 736.

Then, a silicidation process may be performed for forming a silicide 813 in each of the raised source and drain regions 703, 704, 705 and, optionally, in the gate structures 502, 716. For this purpose, a layer of a metal, for example nickel, may be deposited over the semiconductor structure 100, and one or more annealing processes may be performed for initiating a chemical reaction between the metal and the semiconductor material of the raised source and drain regions 703, 704, 705 and the polysilicon layer 406 in the gate structures 502, 716. Unreacted metal may be removed by means of one or more etch processes.

Thereafter, a liner layer 806 and an interlayer dielectric 807 may be formed by means of deposition techniques such as chemical vapor deposition and plasma enhanced chemical vapor deposition. In some embodiments, a planarization process, such as chemical mechanical polishing, may be performed for obtaining a substantially planar surface of the interlayer dielectric 807.

Source and drain contacts 808, 810, 812 providing electrical connections to the raised source and drain regions 703, 704, 705, as well as gate contacts 809, 811 providing electrical connections to the gate structures 502, 716, may be formed. This may be done by etching contact holes through the interlayer dielectric 807 and the liner layer 806, and filing the contact holes with an electrically conductive material such as tungsten. The gate contacts 809, 811 may be provided in a plane that is different from the plane of drawing of FIG. 8. Therefore, in FIG. 8, the gate contacts 809, 811 are shown by dashed lines.

As already mentioned above, the present disclosure is not limited to embodiments wherein the thickness 402 (see FIG. 4) of the trench capping layer 401 obtained after the formation of the trench capping layer 401 is approximately equal to or smaller than the thickness 408 (see FIG. 4) of the gate capping layer 407. In other embodiments, the trench capping layer 401 may have a greater thickness than the gate capping layer 407, so that parts of the trench capping layer 401 that are covered neither by sidewall spacers, nor by portions of gate structures over the trench capping layer 401, may remain in the semiconductor structure after the cap removal etch process wherein the gate capping layer 407 is removed.

Figure 9A:
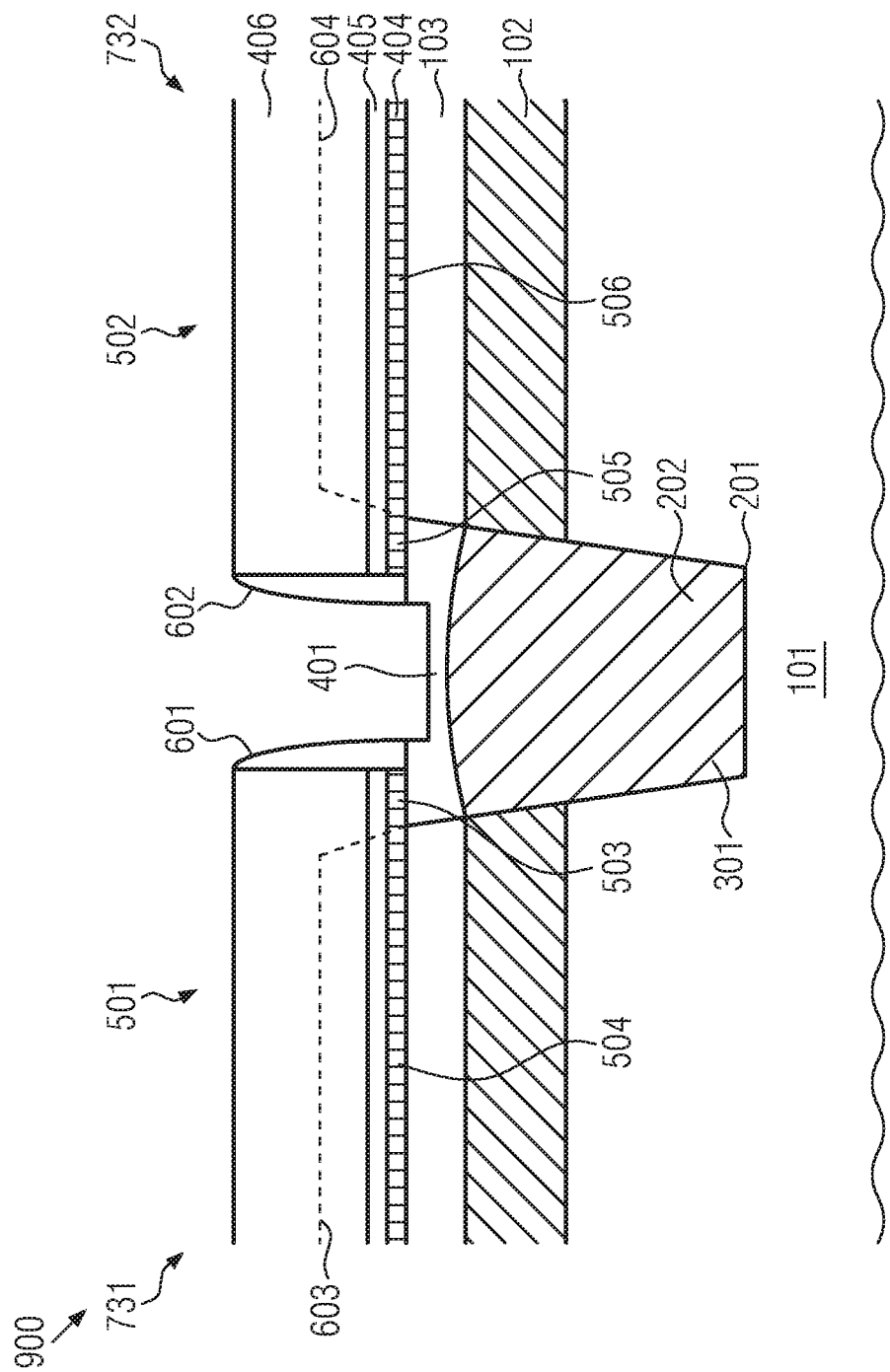
FIGS. 9a and 9b show a schematic cross-sectional view and a schematic top view, respectively, of a semiconductor structure according to an embodiment at a stage of a method of manufacturing a semiconductor structure according to an embodiment.

FIG. 9a shows a schematic cross-sectional view of a semiconductor structure 900 in such embodiments at a stage of the method of manufacturing a semiconductor structure corresponding to that shown in FIG. 7a, which is obtained after the cap removal etch process. Features of the semiconductor structure 900 other than those related to the thicknesses of the trench capping layer 401 and the gate capping layer 407 may correspond to those of the semiconductor structure 100 described above with reference to FIGS. 1-8, wherein like reference numerals have been used to denote like components. Unless explicitly indicated otherwise, components denoted by like reference numerals may have corresponding features, and corresponding methods may be used for the formation thereof.

Figure 9B:
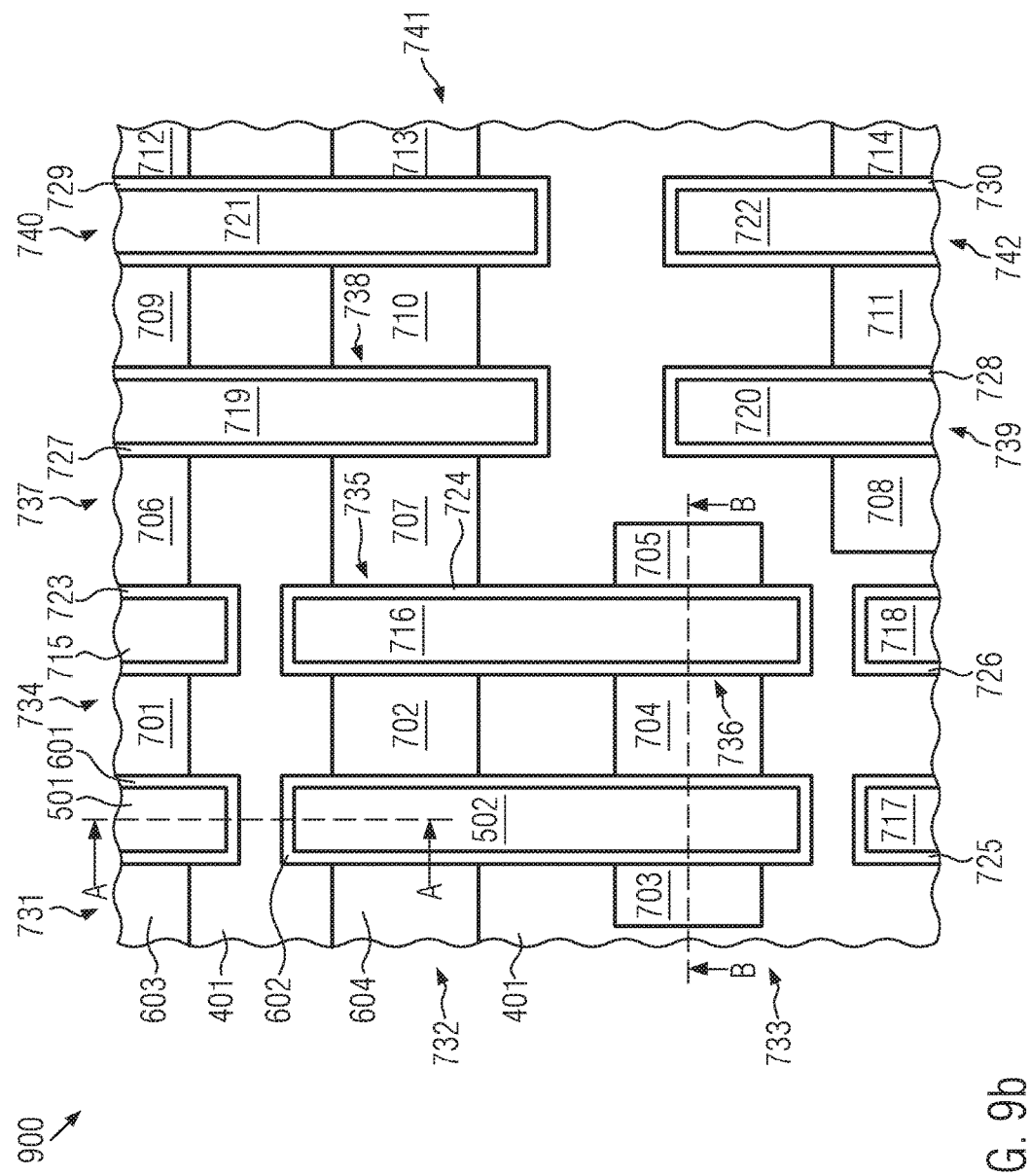
Figure 10:
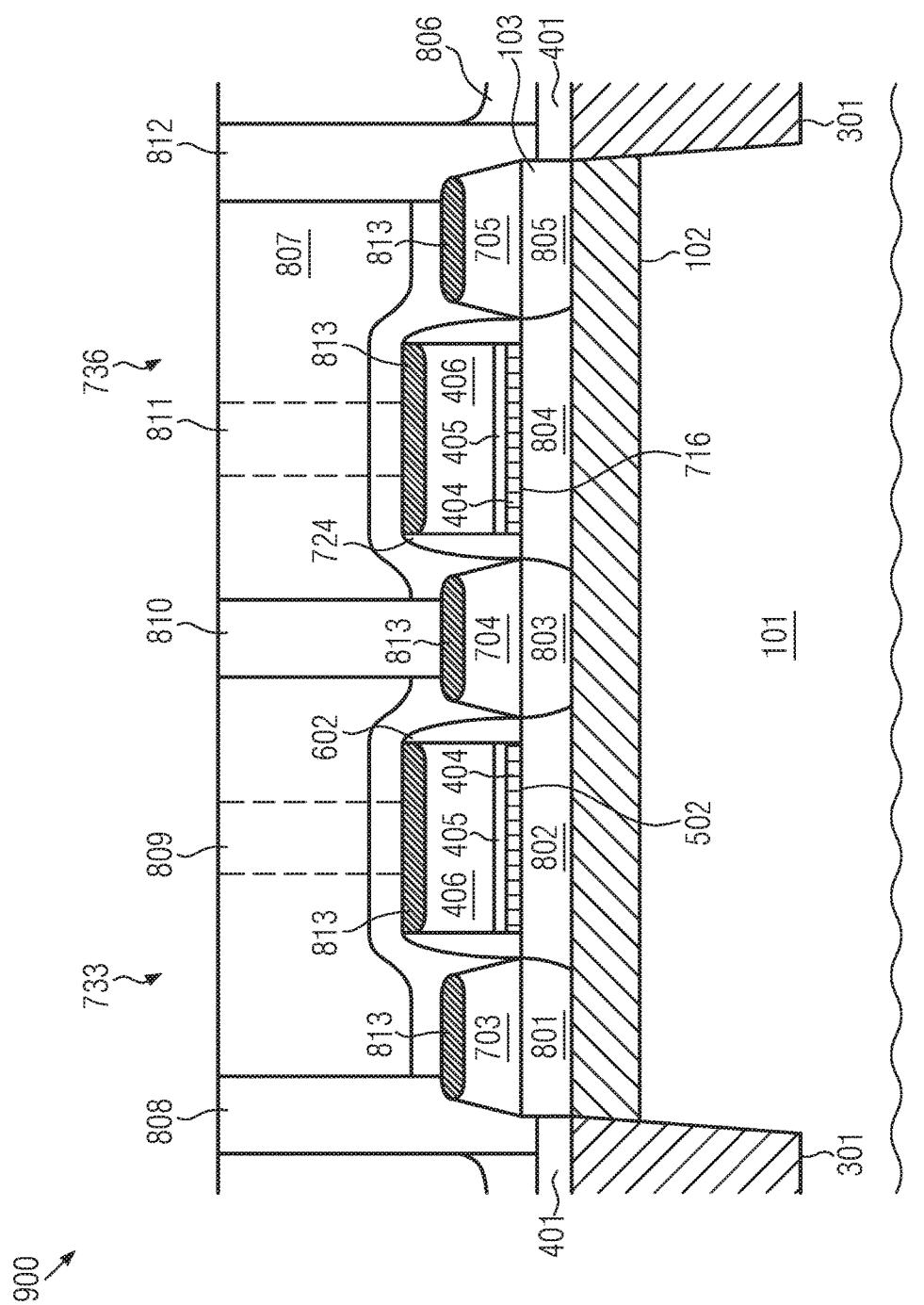
FIG. 10 shows a schematic cross-sectional view of a portion of the semiconductor structure shown in FIGS. 9a-9b at a later stage of the method of manufacturing a semiconductor structure.

A schematic top view of the semiconductor structure 900 at the stage of the method of manufacturing a semiconductor structure shown in FIG. 9a is shown in FIG. 9b, wherein the cross-section of FIG. 9a is along the line A-A shown in FIG. 9b. A schematic cross-sectional view along the line B-B at a later stage of the method of manufacturing a semiconductor structure, corresponding to the stage of the method of manufacturing a semiconductor structure shown in FIG. 8, is shown in FIG. 10.

The semiconductor structure 900 may include a trench capping layer 401 that is provided over a trench isolation structure 301. The trench isolation structure 301 may include a trench 201 filled with a first electrically insulating material 202 such as, for example, silicon dioxide, that is different from a second electrically insulating material, such as, for example, silicon nitride, silicon borocarbonitride and/or silicon carbonitride, from which the trench capping layer 401 is formed. The semiconductor structure 900 further includes gate structures 501, 502 that include portions 504, 506 over a semiconductor material layer 103 that is separated from a support substrate 101 by an electrically insulating layer 102. Additionally, the gate structures 501, 502 may include portions 503, 505 over the trench capping layer 401. The gate structures 501, 502 may include a layer 404 of high-k material, which provides a gate insulation layer, and one or more layers of gate electrode material, which may include a work function adjustment metal layer 405 and a polysilicon layer 406. Adjacent to the gate structures 501, 502, sidewall spacers 601, 602 may be formed, which may be provided over portions of the trench capping layer 401 that are not covered by the gate structures 501, 502. The sidewall spacers 601, 602 can contact the trench capping layer 401 laterally of the layer 404 of high-k material. Between the sidewall spacers 601, 602, there may be a portion of the trench capping layer 401 which may have a smaller thickness than portions of the trench capping layer 401 below the sidewall spacers 601, 602 and portions of the trench capping layer 401 below the gate structures 501, 502. The smaller thickness of the portion of the trench capping layer 401 between the sidewall spacers may be caused by the removal of a part of the material of the trench capping layer 401 in the cap removal etch process. However, the entire trench isolation structure 301, including a portion that is covered neither by the sidewall spacers 601, 602 nor by the gate structures 501, 502, may be covered by the trench capping layer 401. Adjacent to the gate structures 501, 502, a raised source region 603 of a transistor 731 and a raised source region 604 of a transistor 732, respectively, may be provided.

At a side of the gate structure 501 opposite the raised source region 603, a raised source and drain region 701 providing a drain region of the transistor 731 may be provided. At a side of the gate structure 502 opposite the raised source region 604, a raised source and drain region 702 providing a drain region of the transistor 732 may be provided. The semiconductor structure 900 may further include gate structures 715 to 722 of field effect transistors 733 to 742 other than the field effect transistors 731, 732, sidewall spacers 723 to 730 and raised source and drain regions 703 to 714, wherein some of the raised source and drain regions 701 to 714 may provide common raised source and drain regions of pairs of adjacent ones of the field effect transistors 731 to 742.

As can be seen in the top view of FIG. 9b, parts of the surface of the semiconductor structure 900 that are not covered by the gate structures 501, 502, 715 to 722, the sidewall spacers 601, 602, 723 to 730, and the raised source and drain regions 701 to 714 may be covered by the trench capping layer 401, so that substantially no parts of the trench isolation structure 301 are exposed at the surface of the semiconductor structure 900. Thus, the trench capping layer 401 can protect the trench isolation structure 301 from being adversely affected by cleaning agents which, in some embodiments, may be applied to the semiconductor structure 900 at the stage of the method of manufacturing a semiconductor structure shown in FIG. 9b.

FIG. 10 shows a schematic cross-sectional view of the semiconductor structure 900 along the line B-B shown in FIG. 9b in a later stage of the method of manufacturing a semiconductor structure. After the cap removal etch process and the one or more selective epitaxial growth processes, an annealing process may be performed for diffusing dopants from the raised source and drain regions 701 to 714 into portions of the semiconductor material layer 103 therebelow. Thus, source and drain regions 801, 803, 805 may be formed in the semiconductor material layer 103, and portions of the semiconductor material layer 103 below the gate structures 502, 716 may provide channel regions 802, 804 of the field effect transistors 733, 736. The region 801 may provide a source region of the transistor 733, the region 803 may provide a drain region of the transistor 733 and a source region of the transistor 736, and the region 805 may provide a drain region of the transistor 736.

Thereafter, a silicide 813 may be formed in each of the raised source and drain regions 703, 704, 705 and, optionally, the polysilicon layer 406 in the gate structures 502, 716, a liner layer 806 and an interlayer dielectric 807 may be formed, and contacts 808, 809, 810, 811, 812 extending through the inter-layer dielectric 807 and the liner layer 806 and providing connections to the raised source and drain regions 703, 704, 705 as well as the gate structures 502, 716 may be formed.

In some situations, a misalignment of contact holes that are formed for providing the contacts 808, 812 may occur, as schematically illustrated in FIG. 10. In this case, not the entire contact holes are provided over the raised source and drain regions 703, 705, respectively, and parts of the contact holes may be located over the trench isolation structure 301. Since substantially the entire trench isolation structure 301 may be covered by the trench capping layer 401, misaligned contact holes can land on the trench capping layer 401. The interlayer dielectric 807 and/or the liner layer 806 may be formed of a material that may be etched selectively relative to the material of the trench capping layer 401. Thus, even if the contact holes that are formed for providing the contacts 808, 812 land on the trench capping layer 401, the etch process can stop at the trench capping layer 401. Thus, a risk of an inadvertent etching of contact holes through the gate insulation structure 301 and/or the electrically insulating layer 102 occurring may be substantially avoided or at least reduced, even in the case of misaligned contact holes.

The present disclosure is not limited to embodiments wherein the trench capping layer 401 is patterned by means of a mask that is formed by a photolithographic process, as described above. In other embodiments, self-aligned techniques may be used for forming the trench capping layer 401. In the following, such embodiments will be described with reference to FIGS. 11-14. For convenience, in FIGS. 1-10, on the one hand, and in FIGS. 11-14, on the other hand, like reference numerals have been used to denote like components. Unless explicitly indicated otherwise, components denoted by like reference numerals may have corresponding features, and corresponding techniques may be used for the formation thereof.

Figure 11:
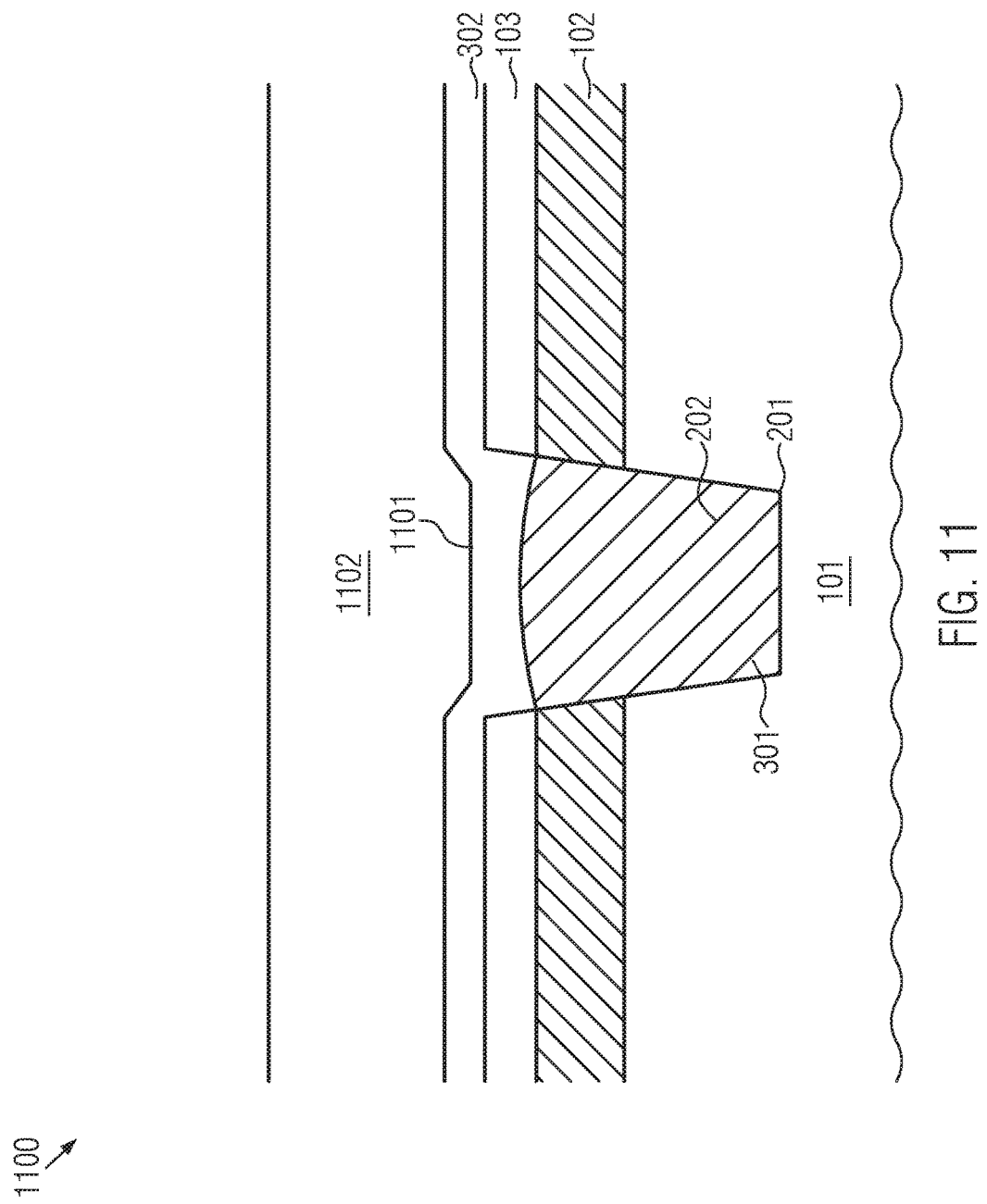

FIG. 11 shows a schematic cross-sectional view of a semiconductor structure 1100 according to an embodiment at a stage of a method of manufacturing a semiconductor structure according to an embodiment. The semiconductor structure 1100 may include a support substrate 101, an electrical insulating layer 102, and a semiconductor material layer 103 that provide a semiconductor-on-insulator structure. Additionally, the semiconductor structure 1100 may include a trench isolation structure 301 that includes a trench 201 filled with a first electrically insulating material 202 such as, for example, silicon dioxide. A surface of the first electrically insulating material 202 in the trench isolation structure 301 may be recessed relative to a surface of a semiconductor material layer 103.

For forming the trench isolation structure 301, techniques as described above with reference to FIGS. 1, 2 and 3 may be employed.

After the formation of the trench isolation structure 301, a layer 302 of a second electrically insulating material that is different from the first electrically insulating material 202, for example, a layer including silicon nitride, silicon borocarbonitride and/or silicon carbonitride, may be deposited over the semiconductor structure 1100. For this purpose, deposition techniques such as chemical vapor deposition or plasma enhanced chemical vapor deposition may be used. A topology of a surface of a layer 302 of the second electrically insulating material may correspond to a topology of surfaces of the trench isolation structure 301 and the semiconductor material layer 103 adjacent thereto. Since the trench isolation structure 301 may be recessed relative to the semiconductor material layer 103, the surface of the layer 302 of the second electrically insulating material may have a recess 1101 over the trench isolation structure 301.

After the formation of the layer 302 of the second electrically insulating material, a layer 1102 of a mask material may be deposited over the semiconductor structure 1100. The layer 1102 of mask material may be formed from a material that may be etched selectively relative to the second electrically insulating material of the layer 302. In embodiments wherein the second electrically insulating material of the layer 302 includes silicon nitride, the layer 1102 of mask material may include silicon dioxide.

Figure 12:
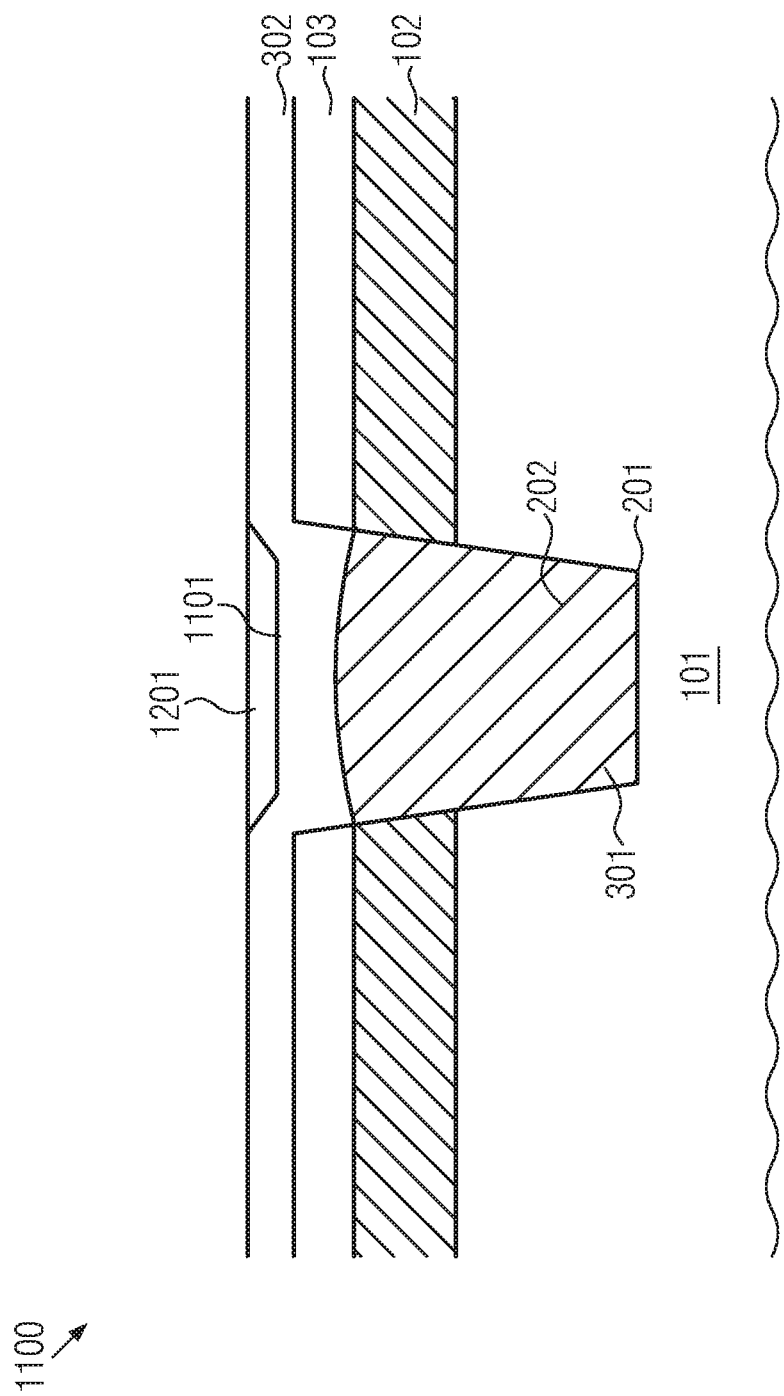

FIG. 12 shows a schematic cross-sectional view of the semiconductor structure 1100 at a later stage of the manufacturing process. After the formation of the layer 1102 of mask material, a chemical mechanical polishing process may be performed. The chemical mechanical polishing process may remove portions of the layer 1102 of mask material that are provided on portions of the layer 302 of the second electrically insulating material over the semiconductor material layer 103. The chemical mechanical polishing process may be stopped as soon as the second electrically insulating material of the layer 302 is exposed at the surface of the semiconductor structure 1100. Portions of the layer 1102 of mask material in the recess 1101 of the layer 302 of the second electrically insulating material may remain in the semiconductor structure 1100, and may provide a mask 1201.

Figure 13:
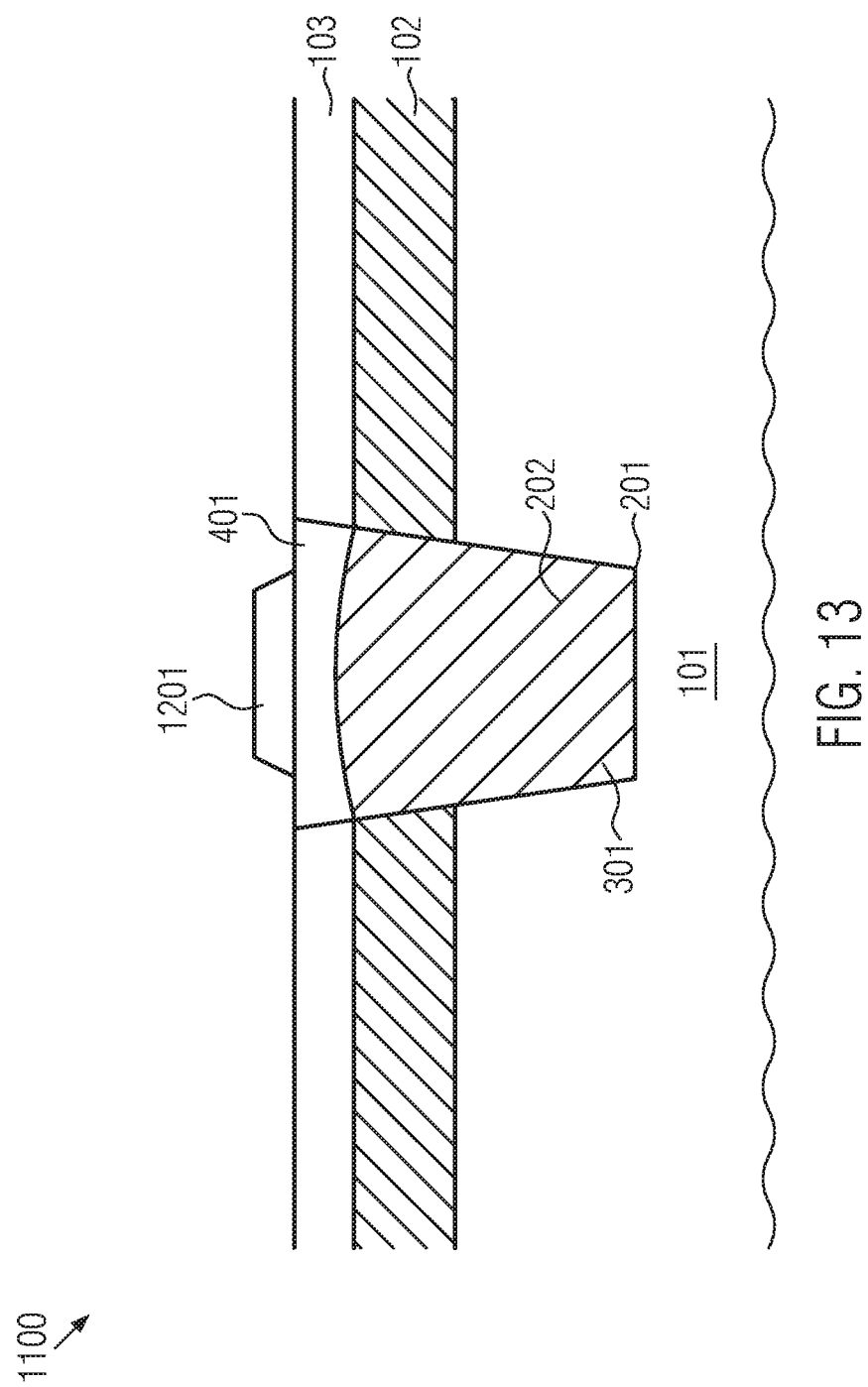

FIG. 13 shows a schematic cross-sectional view of the semiconductor structure 1100 at a later stage of the method of manufacturing a semiconductor structure. After the formation of the mask 1201, an etch process adapted to selectively remove the second electrically insulating material of the layer 302 relative to the material of the mask 1201, for example, a dry etch process adapted to selectively etch silicon nitride relative to silicon dioxide, may be performed. The etch process may remove portions of the layer 302 of the second electrical insulating material on the semiconductor material layer 103. Portions of the layer 302 of the second electrically insulating material below the mask 1201, and portions of the layer 302 of the second electrically insulating material at the edge of the semiconductor material layer 103 adjacent to the trench isolation structure 301, where the layer 302 of the second electrically insulating material may have a greater extension along a thickness direction of the semiconductor structure 1100, corresponding to the vertical direction in the plane of drawing of FIG. 13, may remain in the semiconductor structure 1100, and may provide a trench capping layer 401.

FIG. 14 shows a schematic cross-sectional view of the semiconductor structure 1100 at a later stage of the method of manufacturing a semiconductor structure. After the etching of the layer 302 of the second electrically insulating material, the mask 1201 may be removed by means of a wet or dry etch process adapted to selectively remove the material of the mask 1201 relative to the second electrically insulating material of the trench capping layer 401 and the semiconductor material of the semiconductor material layer 103. This may be done by means of a wet or dry etch process adapted for selectively removing silicon dioxide relative to silicon nitride.

Thereafter, the processing of the semiconductor structure 1100 may be continued as described above with reference to FIGS. 4-10.

The present disclosure is not limited to embodiments wherein semiconductor-on-insulator techniques are used. In other embodiments, a bulk semiconductor substrate, for example, a silicon wafer or die, may be used instead of the arrangement of the support substrate 101, the electrically insulating layer 102 and the layer 103 of semiconductor material described above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method, comprising:
   providing a semiconductor structure comprising a trench isolation structure, said trench isolation structure comprising a first electrically insulating material;
   forming a trench capping layer over said trench isolation structure, said trench capping layer comprising a second electrically insulating material that is different from said first electrically insulating material;
   forming a gate stack over said semiconductor structure, said gate stack comprising a layer of a high-k material and a layer of a gate electrode material;
   patterning said gate stack, wherein a gate structure having a first portion over a first portion of said trench capping layer is formed, said patterning of said gate stack exposing a second portion of said trench capping layer adjacent said gate structure; and
   forming a sidewall spacer adjacent said gate structure, a portion of said sidewall spacer being formed on said exposed second portion of said trench capping layer.

2. The method of claim 1, wherein said gate stack further comprises a gate capping layer comprising said second electrically insulating material, and wherein the method further comprises:
   after the formation of said sidewall spacer, performing a cap removal etch process adapted to remove said second electrically insulating material, said cap removal etch process removing said gate capping layer and at least a part of a third portion of said trench capping layer on a side of said sidewall spacer opposite said gate structure.

3. The method of claim 2, wherein said cap removal etch process substantially completely removes said third portion of said trench capping layer.

4. The method of claim 2, wherein said cap removal etch process removes only a part of said third portion of said trench capping layer, a rest of said third portion of said trench capping layer remaining in said semiconductor structure.

5. The method of claim 2, further comprising, after the formation of said sidewall spacer, performing at least one cleaning process wherein said semiconductor structure is exposed to a cleaning agent capable of etching said high-k material, said sidewall spacer and said trench capping layer providing an encapsulation of a portion of said layer of high-k material in said gate stack, said encapsulation protecting said portion of said layer of high-k material in said gate stack from being affected by said cleaning agent.

6. The method of claim 5, wherein the formation of said trench capping layer comprises:
   depositing a layer of said second electrically insulating material over said semiconductor structure;
   forming a mask over said layer of said second electrically insulating material, the formation of said mask comprising a first photolithography process; and
   performing an etch process adapted to remove said second electrically insulating material, a portion of said layer of said second electrically insulating material below said mask remaining in said semiconductor structure and providing said trench capping layer.

7. The method of claim 5, wherein said trench isolation structure has a surface that is recessed relative to a surface of a semiconductor material adjacent said trench isolation structure, and wherein the formation of said trench capping layer comprises:
   depositing a layer of said second electrically insulating material over said semiconductor structure, a surface of said layer of said second electrically insulating material having a recess over said trench isolation structure;
   depositing a layer of a mask material over said layer of said second electrically insulating material;
   performing a polishing process, said polishing process removing portions of said layer of said mask material outside said recess of said layer of said second electrically insulating material, wherein a portion of said layer of mask material in said recess is not removed and provides a mask;
   performing a trench capping layer etch process adapted to selectively remove said second electrically insulating material relative to said mask material, portions of said layer of said second electrically insulating material that are not removed in said trench capping layer etch process providing said trench capping layer; and
   performing a mask removal etch process adapted to selectively remove said mask material relative to said second electrically insulating material and said semiconductor material adjacent said trench isolation structure, wherein said mask is removed.

8. The method of claim 5, wherein:
   said semiconductor structure comprises a support substrate, an electrically insulating layer over said support substrate and a semiconductor material layer over said electrically insulating layer;
   said gate structure comprises a second portion over a channel region of a field effect transistor, said channel region of said field effect transistor being provided in said semiconductor material layer; and
   the method further comprises:
      forming a source region and a drain region of said field effect transistor in said semiconductor material layer adjacent said gate structure;
      forming a raised source region over said source region and a raised drain region over said drain region;
      forming an interlayer dielectric over said semiconductor structure; and
      forming one or more of a source contact extending through said interlayer dielectric and providing an electrical connection to said raised source region, a drain contact extending through said interlayer dielectric and providing an electrical connection to said raised drain region and a gate contact extending through said interlayer dielectric and providing an electrical connection to said gate structure.

9. The method of claim 6, wherein the formation of said trench isolation structure comprises a second photolithography process, and wherein a first photomask used in said first photolithography process is inverse to a second photomask used in said second photolithography process.

10. The method of claim 6, wherein the formation of said trench isolation structure comprises a second photolithography process, wherein a same photomask is used for said first photolithography process and said second photolithography process, and wherein one of said first photolithography process and said second photolithography process is performed using a positive photoresist and the other of said first photolithography process and said second photolithography process is performed using a negative photoresist.

11. The method of claim 8, wherein said first electrically insulating material comprises silicon dioxide and said second electrically insulating material comprises at least one of silicon nitride, silicon borocarbonitride and silicon carbonitride.

12. The method of claim 10, wherein said patterning of said gate stack comprises a second photolithography process, and wherein a first photomask used in said first photolithography process is inverse to a second photomask used in said second photolithography process.

* * * * *